(12) United States Patent
Vinciarelli et al.

(10) Patent No.: US 8,148,823 B1
(45) Date of Patent: Apr. 3, 2012

(54) LOW LOSS PACKAGE FOR ELECTRONIC DEVICE

(75) Inventors: Patrizio Vinciarelli, Boston, MA (US); Claudio Tuozzolo, Johnston, RI (US)

(73) Assignee: Picor Corporation, North Smithfield, RI (US)

( * ) Notice: Subject to any disclaimer, the term of this patent is extended or adjusted under 35 U.S.C. 154(b) by 290 days.

(21) Appl. No.: 12/637,290

(22) Filed: Dec. 14, 2009

(51) Int. Cl.
*H01L 23/52* (2006.01)
*H01L 23/48* (2006.01)
*H01L 29/40* (2006.01)
*H01L 23/12* (2006.01)
*H01L 23/498* (2006.01)

(52) U.S. Cl. . 257/773; 257/736; 257/700; 257/E23.062; 257/E23.067

(58) Field of Classification Search ............... 257/773, 257/736, 700, E23.062, E23.067
See application file for complete search history.

(56) References Cited

U.S. PATENT DOCUMENTS

| | | | |
|---|---|---|---|
| 5,075,759 A | 12/1991 | Moline | |
| 5,904,499 A | 5/1999 | Pace | |
| 6,278,264 B1 | 8/2001 | Burstein et al. | |
| 6,710,441 B2 | 3/2004 | Eden et al. | |
| 6,747,216 B2 * | 6/2004 | Brist et al. | 174/262 |
| 6,940,013 B2 | 9/2005 | Vinciarelli et al. | |
| 7,038,917 B2 * | 5/2006 | Vinciarelli et al. | 361/778 |
| 7,361,844 B2 | 4/2008 | Vinahashi et al. | |
| 7,417,309 B2 * | 8/2008 | Takahashi et al. | 257/687 |
| 7,675,186 B2 * | 3/2010 | Chen et al. | 257/790 |
| 7,838,977 B2 * | 11/2010 | Sun et al. | 257/686 |
| 2007/0085187 A1 * | 4/2007 | Sun et al. | 257/686 |

OTHER PUBLICATIONS

Application Note AN-1136, "Discrete Power Quad Flat Pack No-Leads (PQFN) Board Mounting Application Note," Version 1.0, Jun. 2008, published by International Rectifier Corporation, El Segundo, CA 90245, USA.
"Semelab Aerospace Package Dimensions, SMD05 (TO-276AA)," version 1.01, Aug. 2002, published by Semelab PLC, Lutterworth Leicestershire UK.
"Surface Mount Packages for Electronic Devices," 2009, published by Kyocera Corporation [online] [retrieved Feb. 9, 2009] retrieved from http://www3.kyocera.co.jp.
"Semiconductor Components," 2009, published by Kyocera Corporation [online] [retrieved Feb. 9, 2009] retrieved from http://www3.kyocera.co.jp.
"Laser and Photo Diode Submounts," published by REMTEC, Norwood, MA 02062, USA.
"Power Surface Mounts," published by HCC Industries, Rosemead CA 91770, USA [online] [retrieved Feb. 9, 2009] retrieved from http://hccindustries.com.
"Ceramic Surface Mount Packages," published by Semelab [online] [retrieved on Feb. 9, 2009] retrieved from http://www.semelab.com/mil/pack_range_csm.shtml.

* cited by examiner

*Primary Examiner* — Luan C Thai
(74) *Attorney, Agent, or Firm* — Fish & Richardson P.C.

(57) ABSTRACT

A package for one or more semiconductor die is described. A generally rectangular package includes two large terminals that occupy substantially the entire length of the package and provide low resistance connections. Additional connections may be provided preferably in a central portion of a short end of the package. BGA connections between the semiconductor die and the package substrate provide low impedance connections between the die and the package contacts. The package and connections facilitate current flow orthogonal to the longest package dimension maximizing conductor width and minimizing interconnection resistance.

21 Claims, 21 Drawing Sheets

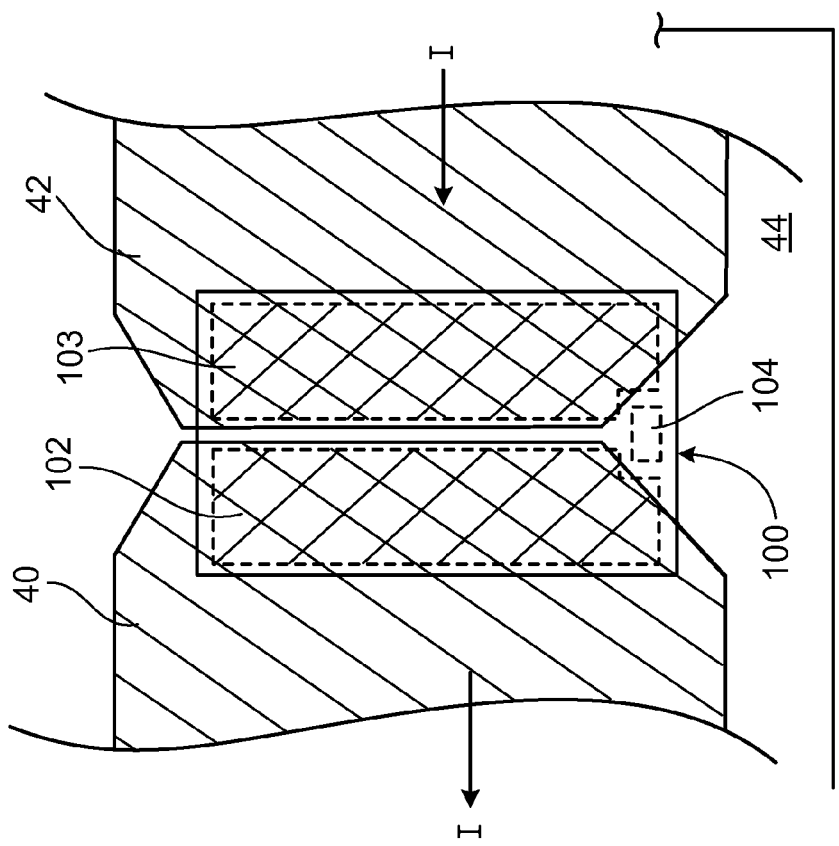
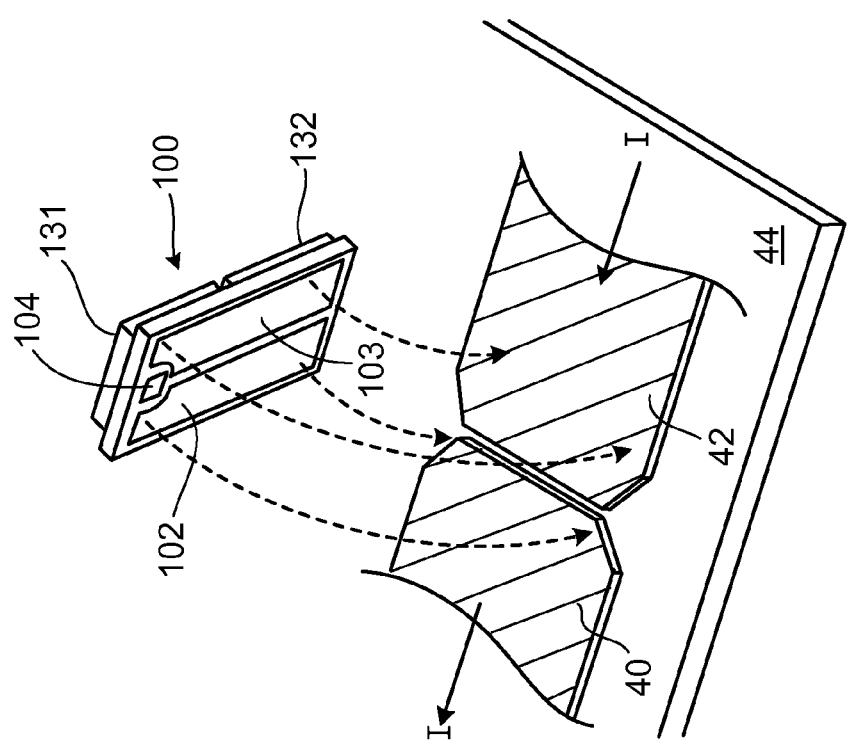
FIG. 9B
FIG. 9A

LOW LOSS PACKAGE FOR ELECTRONIC DEVICE

TECHNICAL FIELD

This invention relates to a low electrical impedance package for an electronic device, more particularly the invention relates to a low electrical impedance package for a power semiconductor device.

BACKGROUND

An electronic device may comprise a plurality of components mounted to a printed circuit assembly (such as, e.g., a single or multilayer fiberglass printed circuit board (PCB), a single or multilayer ceramic PCB). The printed circuit assembly may include patterns of conductive elements (e.g., pads, traces, and/or planes) to interconnect the components in a predetermined way.

For some semiconductor components, a plurality of terminations on the surface of a die are interconnected to form a component terminal. An example of such a component is a power MOSFET, which can include a plurality (in some cases many thousands) of active cells, each cell comprising a drain, source and gate termination. The drain terminal of the component can be formed by connecting essentially all of the drain terminations of the active cells together. Likewise, the source and gate terminals can be formed by connecting essentially all of the source and gate terminations of the active cells together.

"Lateral" power MOSFET devices may include a plurality of active cells comprising drain, source, and gate terminations. However, unlike a "vertical" MOSFET, which has the drain and source terminations of individual cells disposed on opposite surfaces of a die, all of the gate, source, and drain terminations of the cells of a lateral MOSFET may reside on a single surface of the die.

Semiconductor components may be mounted directly to a printed circuit assembly. One way to do this, shown in FIGS. 1A and 1B, is to directly connect conductive pads (e.g., pads 10a, 10b, 10c) on the surface of the printed circuit assembly 12 to interconnection pads (not shown) on the surface of a semiconductor die 14 by use of area array interconnects (e.g., ball-grid array interconnects 16a, 16b, and 16c). The area array interconnects may be made, e.g., of solder or conductive epoxy. Stud bumps may also be used. The assembly method shown in FIG. 1 is sometimes referred to as a "flip-chip" assembly.

Connecting a lateral MOSFET die to a printed circuit assembly using a flip-chip assembly technique presents unique problems if low-impedance source and drain connections are desired. One way to make low electrical impedance connections between such a device and a printed circuit assembly is discussed in Vinciarelli et al, U.S. Pat. No. 7,038,917, "Low Loss, High Density, Array Interconnection," assigned to VLT, Inc. of Sunnyvale, Calif. and incorporated by reference in its entirety (the "Array Patent"). Another way to interconnect a plurality of connections disposed on the same side of a die is described with respect to a voltage regulator integrated circuit in Burstein et al., U.S. Pat. No. 6,278,264, "Flip-Chip Switching Regulator."

Another way to connect a semiconductor die to a printed circuit assembly is to pre-assemble the die into a package having terminal connections and solder the terminal connections to pads on the surface of the printed circuit assembly. Examples of such package embodiments include D-Pak, DirectFET and Power QFN packages manufactured by International Rectifier Corporation, El Segundo, Calif. 90245, USA; and LCC1, SMD1, SMD2 and SMD05 packages manufactured by TTElectronics Semelab, Lutterworth Leicestershire, UK. Another example of a power semiconductor package is found in Moline, U.S. Pat. No. 5,075,759, "Surface Mounting Semiconductor Device and Method". Recommended pad layouts for a package of this kind are illustrated in Application Note AN-1136, "Discrete Power Quad Flat Pack No-Leads (PQFN) Board Mounting Application Note," Version 1.0, June 2008, published by International Rectifier Corporation, El Segundo, Calif. 90245, USA. Examples of semiconductor packages that comprise a multilayer substrate as part of the package are described in Eden et al, U.S. Pat. No. 6,710,441, "Power Semiconductor Switching Devices . . . " and in Pace, U.S. Pat. No. 5,904,499, "Package for Power Semiconductor Chips."

SUMMARY

In one aspect, in general, an apparatus including a chip-scale package for semiconductor devices is provided. The chip-scale package includes a generally rectangular substrate having three dimensions including a length, a width, and a thickness, each dimension being generally orthogonal to the other dimensions. The substrate length is greater than or equal to the substrate width, the length and width defining a first generally planar surface on which one or more semiconductor dice may be mounted and a generally planar second surface on which two or more conductive terminals may be formed. The first and second surfaces have a first edge and a second edge defined by the substrate length. The second surface includes a first zone and a second zone, the first and second zones each being generally rectangular in shape, having a zone length substantially equal to the substrate length and being located adjacent to the first and second edges, respectively, and having an area occupying substantially half of the second surface. The chip-scale package includes a first terminal having a contact area disposed on the second surface, occupying substantially all of the first zone, and having an outside edge occupying substantially all of the first edge; and a second terminal having a contact area disposed on the second surface, occupying substantially all of the second zone, and having an outside edge occupying substantially all of the second edge.

Implementations of the apparatus may include one or more of the following features. The apparatus includes a first semiconductor die mounted to the first surface, having a plurality of first contacts electrically connected to the first terminal and a plurality of second contacts mounted to the second terminal, in which the first surface is approximately the same as the semiconductor die in size. The second surface further includes a third zone near a central portion of a third edge, the third zone having an area that is small in relation to the first and second zones; and a third terminal having a contact area disposed on the second surface in the third zone. The first zone has a notch near the third zone. In some examples, the package has exactly three terminals and the contact area of each of the first and second terminals is at least 50 times greater than the contact area of the third terminal. In some examples, the package has exactly two terminals, the contact area of each of the first and second terminals is at least 30 percent of the area of the second surface. The package is free of conductive terminations in areas between the outside edges of the first and second terminals and the first and second edges. In some examples, each of the first and second zones has a length that is at least 90% of the length of the substrate.

In some examples, each of the first and second zones has a length that is at least 80% of the length of the substrate.

The apparatus includes a first semiconductor die mounted to the first surface, having a plurality of first contacts electrically connected to the first terminal and a plurality of second contacts mounted to the second terminal; and a second semiconductor die mounted to the first surface adjacent to the first semiconductor die, the second die having a plurality of first contacts electrically connected to the first terminal and a plurality of second contacts electrically connected to the second terminal; wherein the first surface is approximately the same as a combined size of the first and second semiconductor dice; and wherein the substrate length is approximately twice the substrate width. The second surface includes a third zone near a central portion of a third edge, the third zone having an area that is small in relation to the first and second zones; a third terminal having a contact area disposed on the second surface in the third zone. In some examples, the package has exactly three terminals and the contact area of each of the first and second terminals is at least 50 times greater than the contact area of the third terminal. The apparatus further includes a printed circuit board having first and second landings for accommodating the first and second terminals, wherein current flows from the first landing into the first terminal and out through the second terminal into the second landing, and wherein the current flows in a direction substantially orthogonal to the substrate length. In some examples, the package has exactly two terminals, and the contact area of the first and second terminals each includes 25 percent or more of the area of the second surface. In some examples, the package has exactly two terminals, and the contact area of the first and second terminals each includes 30 percent or more of the area of the second surface. In some examples, the package has exactly two terminals, and the contact area of the first and second terminals each includes 35 percent or more of the area of the second surface. In some examples, the package is completely free of conductive terminations between the outside edges of the first and second terminals and the first and second edges. In some examples, the package is substantially free of conductive terminations between the outside edges of the first and second terminals and the first and second edges.

The apparatus further includes a plurality of semiconductor dice mounted adjacent to each other to the first surface, having a plurality of first contacts electrically connected to the first terminal and a plurality of second contacts mounted to the second terminal; wherein the first surface is approximately the same as a combined size of the semiconductor dice. The apparatus further includes a circuit board having a first conductive trace including a first contact area for making an electrical connection to the first terminal of the chip scale package, the first contact area accommodating substantially all of the first terminal; and a second conductive trace including a first contact area for making electrical connection to the second terminal of the chip scale package, the first contact area accommodating substantially all of the second terminal; the first and second conductive traces extending generally orthogonally from the respective first and second terminals, and having a conductor width substantially equal to or greater than the substrate length.

The apparatus further includes a second chip-scale package for semiconductor devices including a generally rectangular substrate having (i) three dimensions including a length, a width, and a thickness, (ii) each dimension being generally orthogonal to the other dimensions, (iii) the substrate length being greater than or equal to the substrate width; and (iv) length and width defining a first generally planar surface on which one or more semiconductor dice may be mounted and a generally planar second surface on which two or more conductive terminals may be formed, (v) the first and second surfaces having a first edge and a second edge defined by the substrate length; the second surface including a first zone and a second zone, the first and second zones each being generally rectangular in shape, having a zone length substantially equal to the substrate length and being located adjacent to the first and second edges, respectively, and having an area occupying substantially half of the second surface; a first terminal having a contact area disposed on the second surface, occupying substantially all of the first zone, and having an outside edge occupying substantially all of the first edge; a second terminal having a contact area disposed on the second surface, occupying substantially all of the second zone, and having an outside edge occupying substantially all of the second edge; and wherein the first conductive trace of the circuit board includes a second contact area for making an electrical connection to the first terminal of the second chip scale package, the first contact area accommodating substantially all of the first terminal of the second chip-scale package; the second conductive trace of the circuit board includes a second contact area for making electrical connection to the second terminal of the second chip scale package, the second contact area accommodating substantially all of the second terminal of the second chip-scale package; the first and second contact areas of the first and second conductive traces are arranged end-to-end lengthwise; and the conductor width of at least one of the first and second conductive traces is substantially equal to or greater than the sum of the substrate length of the chip scale package and the substrate length of the second chip scale package.

DESCRIPTION OF DRAWINGS

We first briefly describe the drawings.

FIGS. 9A and 9B respectively show an exploded perspective view and a phantom view, looking from above, of the connection of the assembly of FIG. 5 to conductive traces on a printed circuit assembly.

Like reference symbols in the various drawings indicate like elements.

DETAILED DESCRIPTION

Contemporary power MOSFET devices (i.e., in die form) may exhibit very low ON resistances (e.g., below 500 microOhms). MOSFET devices of this kind may be supplied in a package that comprises terminals (e.g., a source terminal, a drain terminal and a gate terminal) for connection to a printed circuit assembly. In order to fully exploit the low ON resistance of a MOSFET, it is important that package impedances (e.g., resistance, inductance contributed by the package) be low.

Figure 1A:
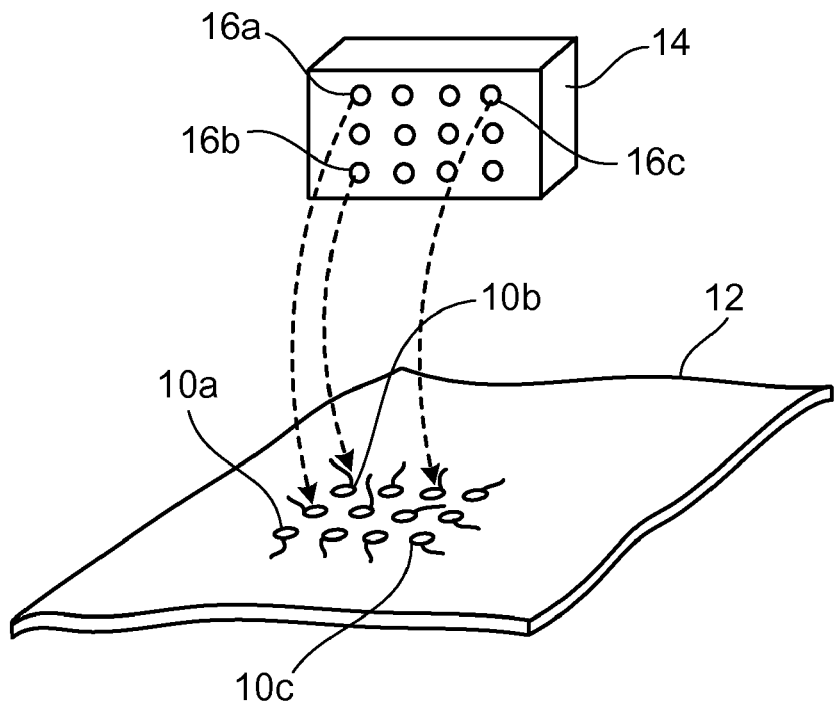
FIGS. 1A and 1B show, respectively, an exploded perspective view and a perspective view of a flip-chip assembly.
Figure 1B:
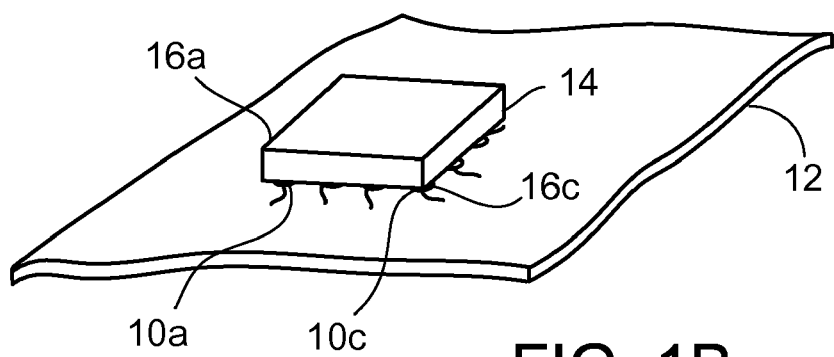
Figure 2:
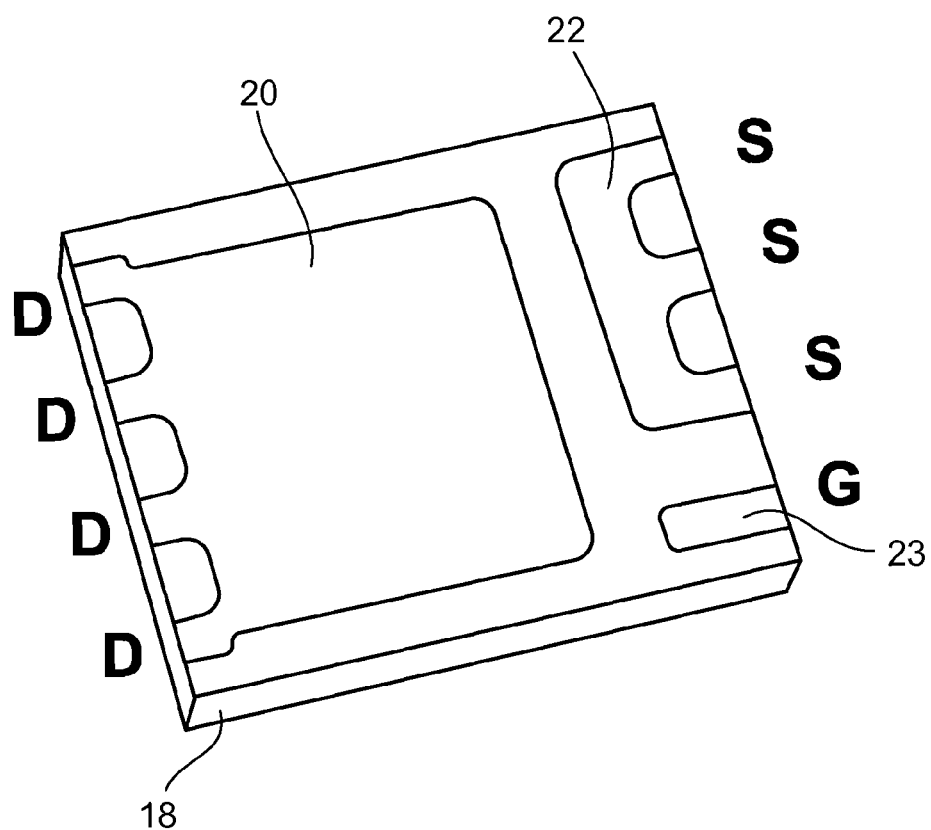
FIG. 2 shows a bottom perspective view of a semiconductor package.
Figure 3A:
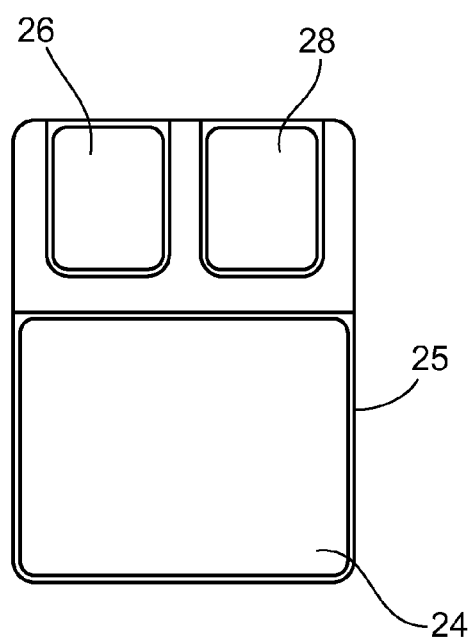
FIGS. 3A and 3B show, respectively, bottom and side views of another semiconductor package.
Figure 3B:
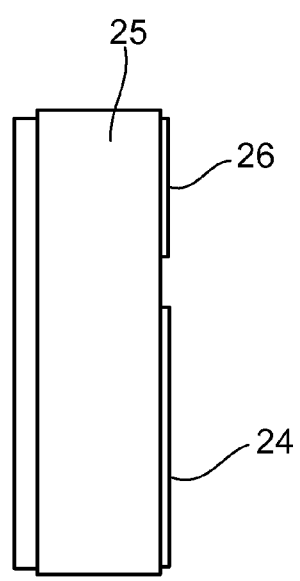

Examples of packages for power MOSFETs are shown in FIGS. 2, 3A and 3B. FIG. 2 is a bottom perspective view of a MOSFET Power QFN package 18 (see, e.g., application note AN-1136, "Discrete Power Quad Flat Pack No-Leads (PQFN) Board Mounting Application Note," Rev. 1.0, June 2008, published by International Rectifier Corporation, El Segundo, Calif., USA), showing the MOSFET drain terminal 20, source terminal 22 and gate terminal 23. FIGS. 3A and 3B are bottom and side views, respectively, of another power MOSFET package 25 (see, e.g., drawing "Semelab Aerospace Package Dimensions, SMD05 (TO-276AA)," version 1.01, August 2002, published by Semelab PLC, Lutterworth Leicestershire, UK), showing MOSFET terminals 24, 26, 28.

Figure 4A:
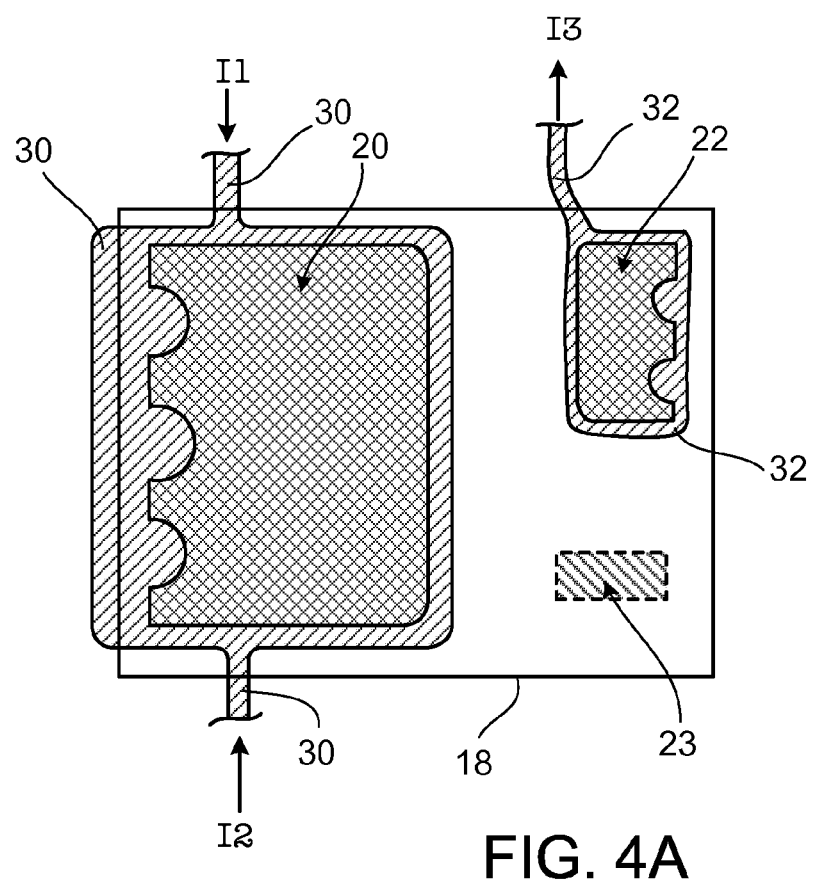
FIG. 4A is a bottom phantom view of the package of FIG. 2 connected to conductive traces on a printed circuit assembly.
Figure 4B:
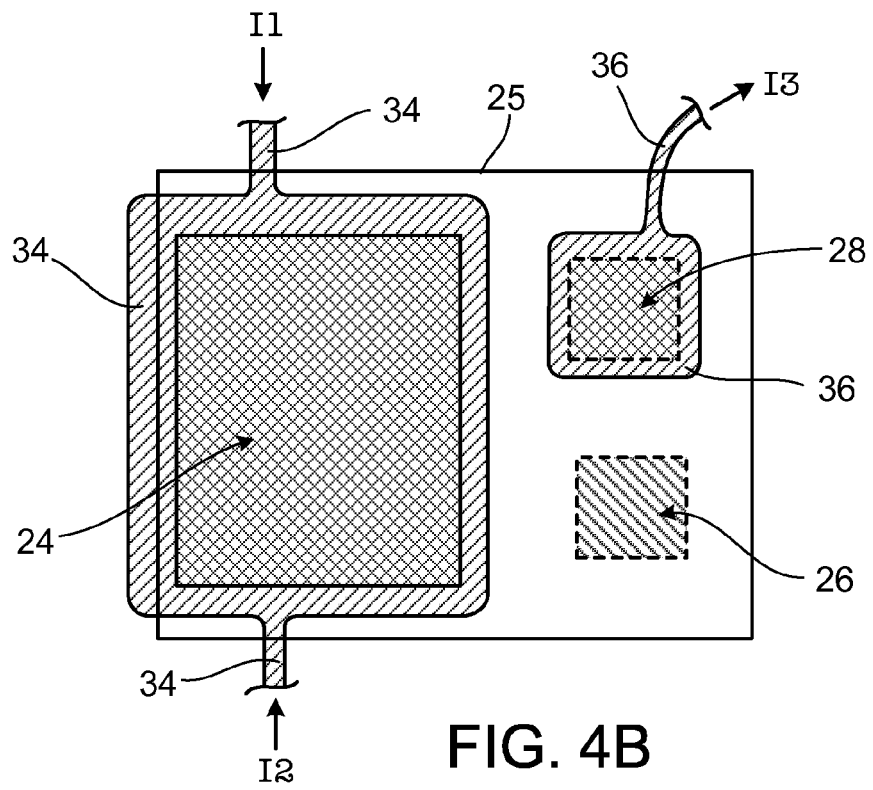
FIG. 4B is a bottom phantom view of the package of FIG. 3 connected to conductive traces on a printed circuit assembly.

FIG. 4A is a bottom phantom view of the package 18 of FIG. 2 mounted to conductive traces on a printed circuit assembly. FIG. 4B is a bottom phantom view of the package 25 of FIG. 3 mounted to conductive traces on a printed circuit assembly. In FIG. 4A the drain terminal 20 of package 18 is connected to conductive pad 30 and the source terminal 22 is connected to conductive pad 32. Similarly, in FIG. 4B terminal 24 (which may be the drain terminal) of package 25 is connected to conductive pad 34 and terminal 28 (which may be the source terminal) is connected to conductive pad 36. In FIGS. 4A and 4B the flow of drain current is indicated by the arrows marked I1 and I2 and the flow of source current in the MOSFET is indicated by the arrow marked I3 (where I3=I1+I2, ignoring the typically very small gate current). It is apparent in both FIGS. 4A and 4B that the relative resistances of the respective source and drain conductive traces are not balanced: in FIG. 4A, the source terminal 22 is smaller in area than the drain terminal 20 and the source trace 32 is smaller in width than the drain trace 30, and in FIG. 4B the source terminal 28 is smaller in area than the drain terminal 24 and the source trace 36 is smaller in width than the drain trace 34. In each case, the difference in the sizes of the source and drain pads and traces is a direct result of the package configuration, specifically the relative size, shape, and location of the package's source and drain terminals.

An improved package 100 is illustrated in FIGS. 5 through 8. As shown in FIGS. 5A and 5B and FIGS. 6A and 6B, the package 100 comprises semiconductor die 131, 132 (it is understood that the use of two die 131, 132 is illustrative and that alternate embodiments may comprise any number of die, 1, 2, 3, etc.) connected by means of solder balls 133 to conductive regions on a substrate 110 which may be a multilayer printed circuit board ("PCB"). As illustrated in FIG. 5A the substrate 110 is generally rectangular in shape and is of length L, width W and thickness D, where the length L is greater than or equal to the width W. The length L and width W define the outline of a generally planar top surface 111E and a generally planar bottom surface 111F.

Figure 6A:
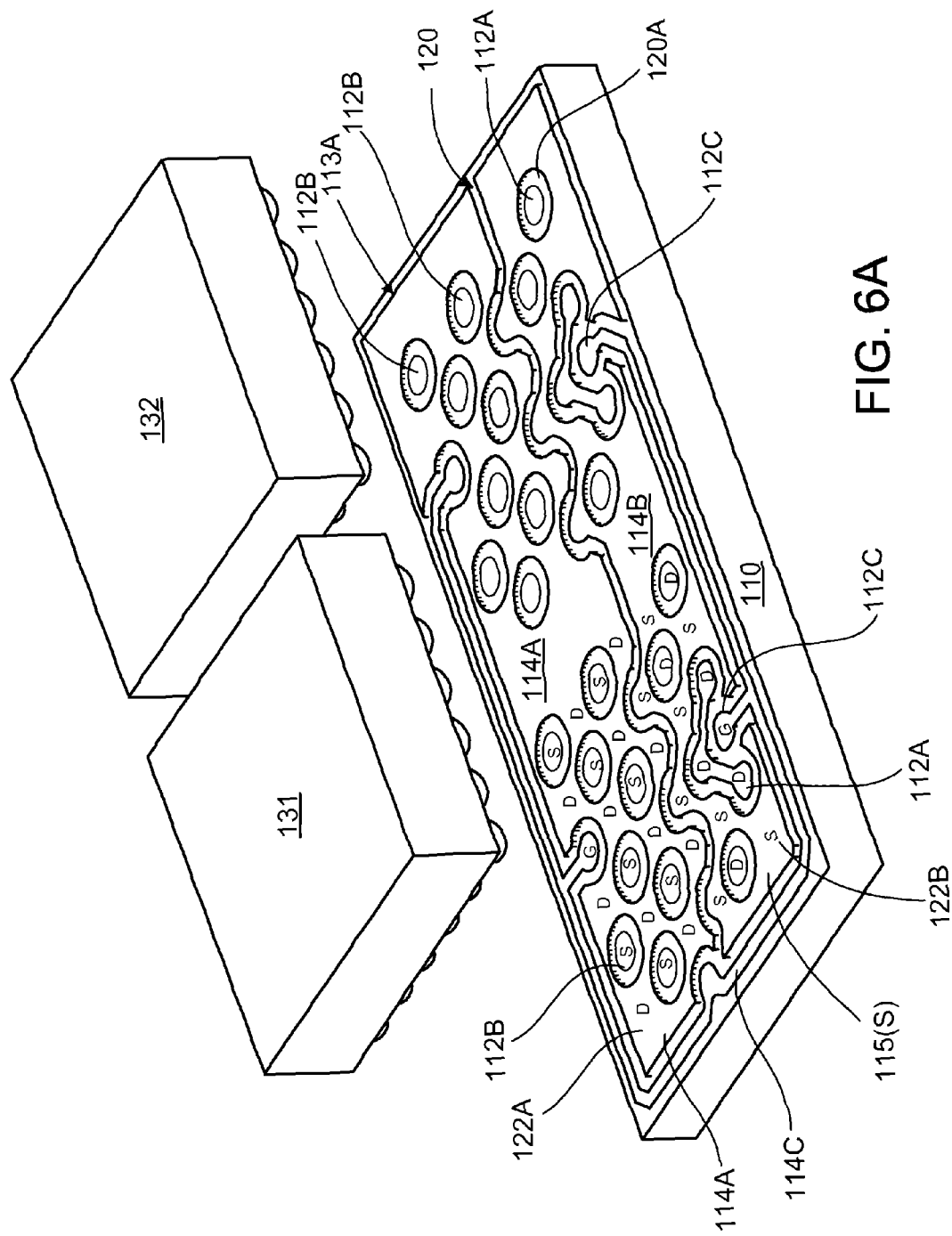
FIGS. 6A and 6B are, respectively, exploded perspective views of the assembly of FIGS. 5A and 5B.

In FIG. 6A, conductive patterns, e.g., conductive sheets 114A and 114B and conductive trace 114C, formed in the top conductive layer 113*a* of PCB 110 may be electrically isolated from each other by forming regions (such as regions 120), free of conductive material, e.g. using an etchant. Likewise, conductive landing pads 112 may be electrically separated from conductive sheets 114A, 114B by other regions that are free of conductive material (e.g., regions 120A).

Figure 6B:
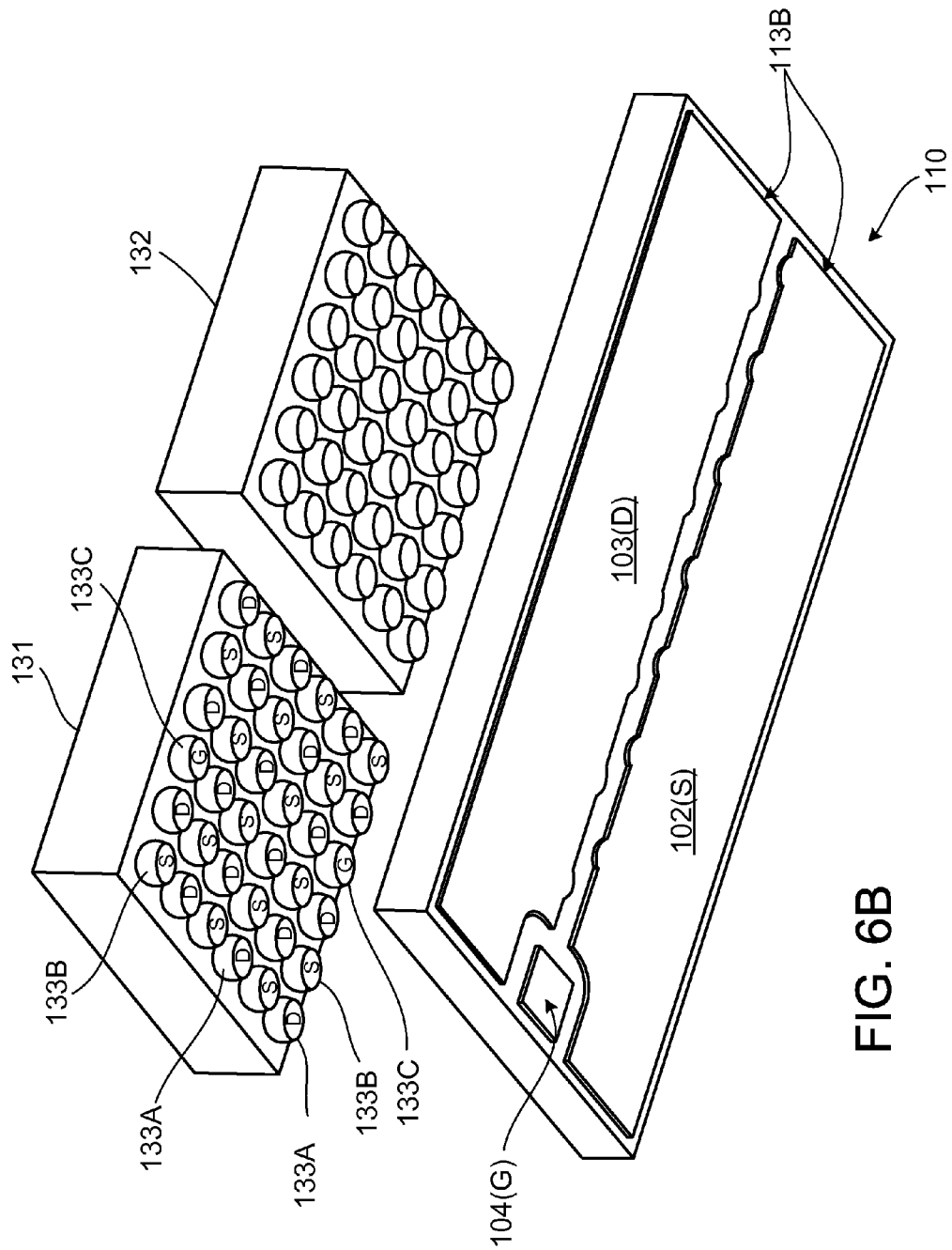
Figure 11A:
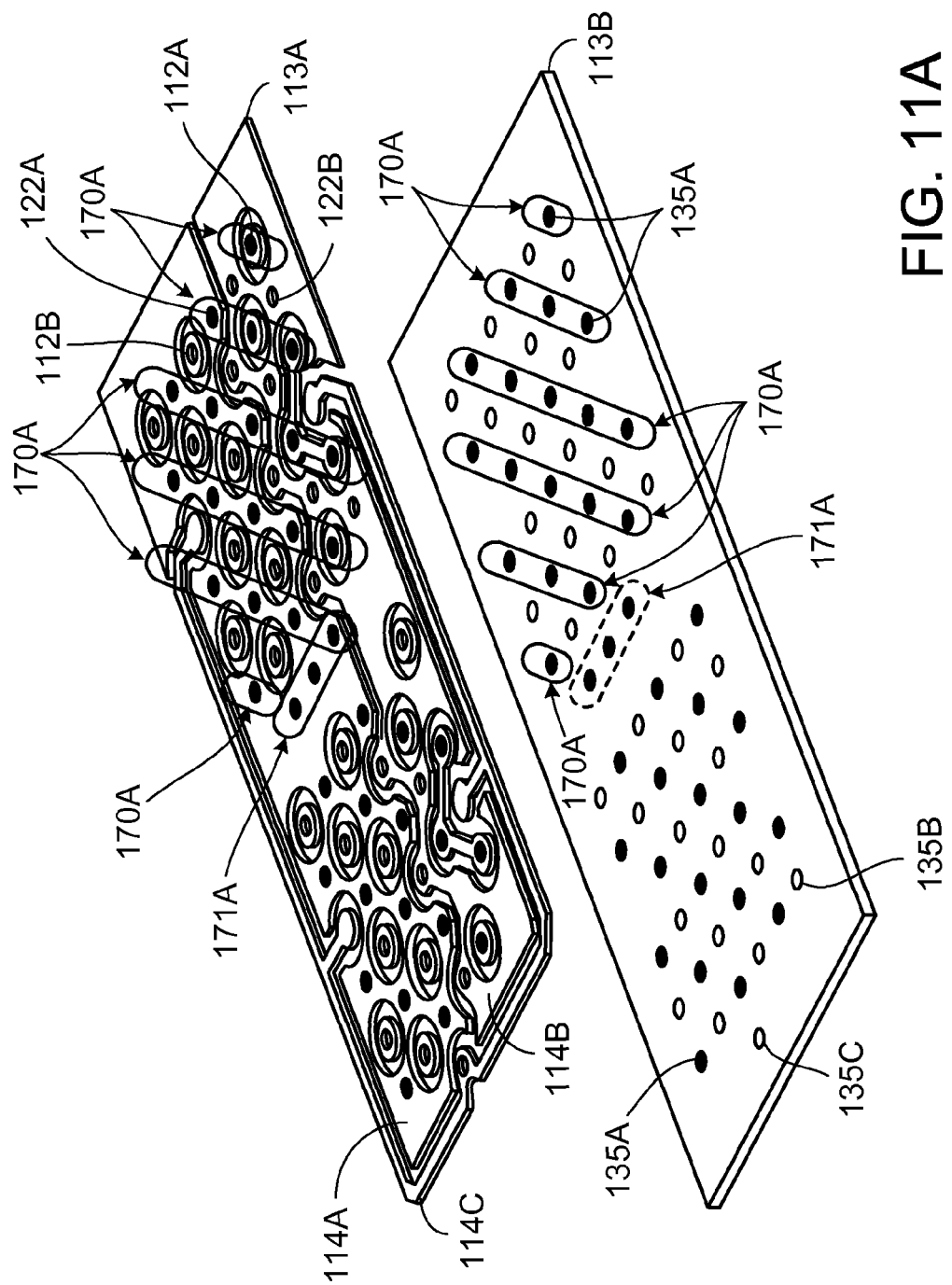
FIGS. 11A and 11B are exploded views showing a portion of the PCB of FIG. 10.
Figure 11B:
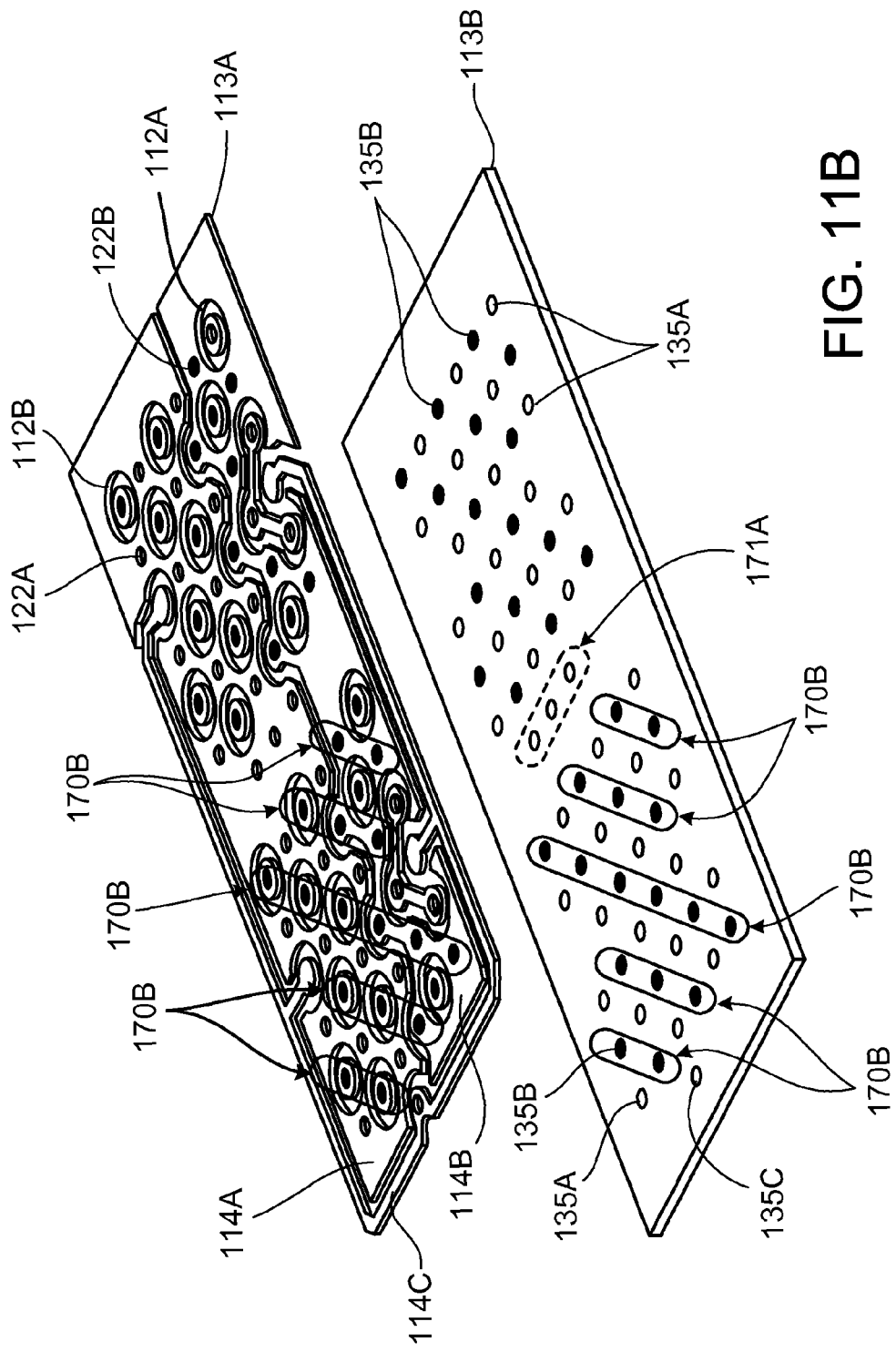

In the example shown in the Figures, the semiconductor die 131, 132 each comprise a ball-grid array of thirty-six (36) solder balls 133. Referring to FIG. 6B, die 131 is shown having eighteen (18) balls labeled "D" (e.g., balls 133*a*) representing drain connections; sixteen (16) balls labeled "S" (e.g., balls 133*b*) representing source connections; and two (2) balls labeled "G" (e.g., balls 133*c*) representing gate connections. Source and drain solder balls 133*b* are shown to generally alternate in both the rows and columns of the array (with the exception of the two gate solder balls 133*c*) and generally align in alternating diagonal rows, e.g., drain rows 170A and source rows 170B as shown in FIGS. 11A and 11B respectively.

Figure 5A:
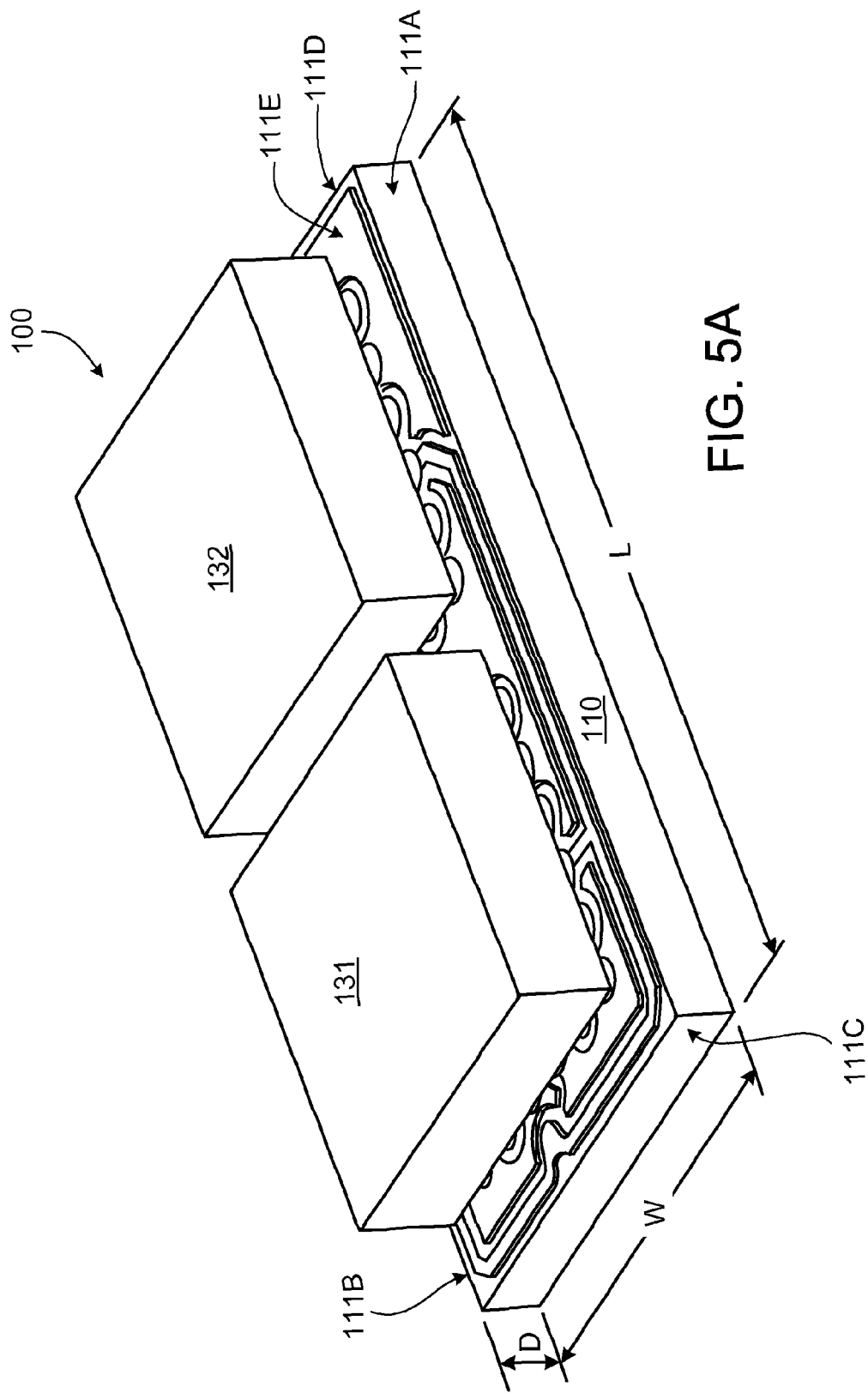
FIGS. 5A and 5B are, respectively, a top perspective view and a bottom perspective view of an assembly for use in a chip scale package according to the invention.

As shown in FIGS. 5A and 6A, conductive pads and traces are provided on the top surface 111E of multilayer PCB 110 to connect to the solder balls 133 of die 131, 132. FIG. 6A shows the locations (labeled "D", "S" and "G" on the top surface 111E of substrate 110) to which corresponding solder balls on the die 131 are connected. The solder ball pattern of source, drain and gate connections of each of the dies 131, 132 may be the same as is assumed by the conductive patterns in FIG. 6A. As illustrated in FIG. 6A and described in more detail below, the top conductive layer 113A of PCB 110 may be divided into two primary conductive sheets 114A and 114B (by removing portions of the conductive layer, e.g., in regions 120, 120A) having roughly equal proportions dedicated to making the drain and source connections, respectively. As shown, some of the source solder balls 133B connect directly to conductive sheet 114B at contact points 122B while others connect to landing pads 112B (which because of their location are isolated from adjacent conductive sheet 114A). Similarly some of the drain solder balls 133A connect directly to conductive sheet 114A at contact points 122A while others connect to landing pads 112A (which are isolated from adjacent conductive sheet 114B). The gate solder balls 133*c* connect to pads 112*c* which are connected directly to conductive trace 114C.

Referring to FIGS. 6B and 10, multilayer PCB 110, as described more fully below, connects the source solder balls 133*b* on the two die 131, 132 to a first terminal 102 on the bottom surface 111F of multilayer PCB 110; connects the drain solder balls 133*a* on the two die 131, 132 to a second terminal 103 on the bottom surface 111F of multilayer PCB 110; and connects the gate solder balls 133*c* on the two die 131, 132 to a control terminal 104 on the bottom surface 111F of multilayer PCB 110.

The location, size, and shape, of each of the terminals 102, 103, and 104 may be generally defined by describing conceptual "zones" in which each is located. Referring to FIG. 5C, the generally planar bottom surface 111F is shown divided into two zones, a first zone 180 and a second zone 182, each being generally rectangular in shape and having a zone length substantially equal to the substrate length L. As shown the first zone 180 is located adjacent to a first edge 184 of the substrate 110, and the second zone 182 is located adjacent to a second edge 186 of the substrate 110. Each of the first zone 180 and the second zone 182 has an area occupying substantially half of the bottom surface 111F. The first and second contacts are each located within and occupy substantially all of their respective first and second zones. In some examples, each of the first and second contacts has a length that is at least 80%, or 90% of the length L of the substrate 110.

Figure 5B:
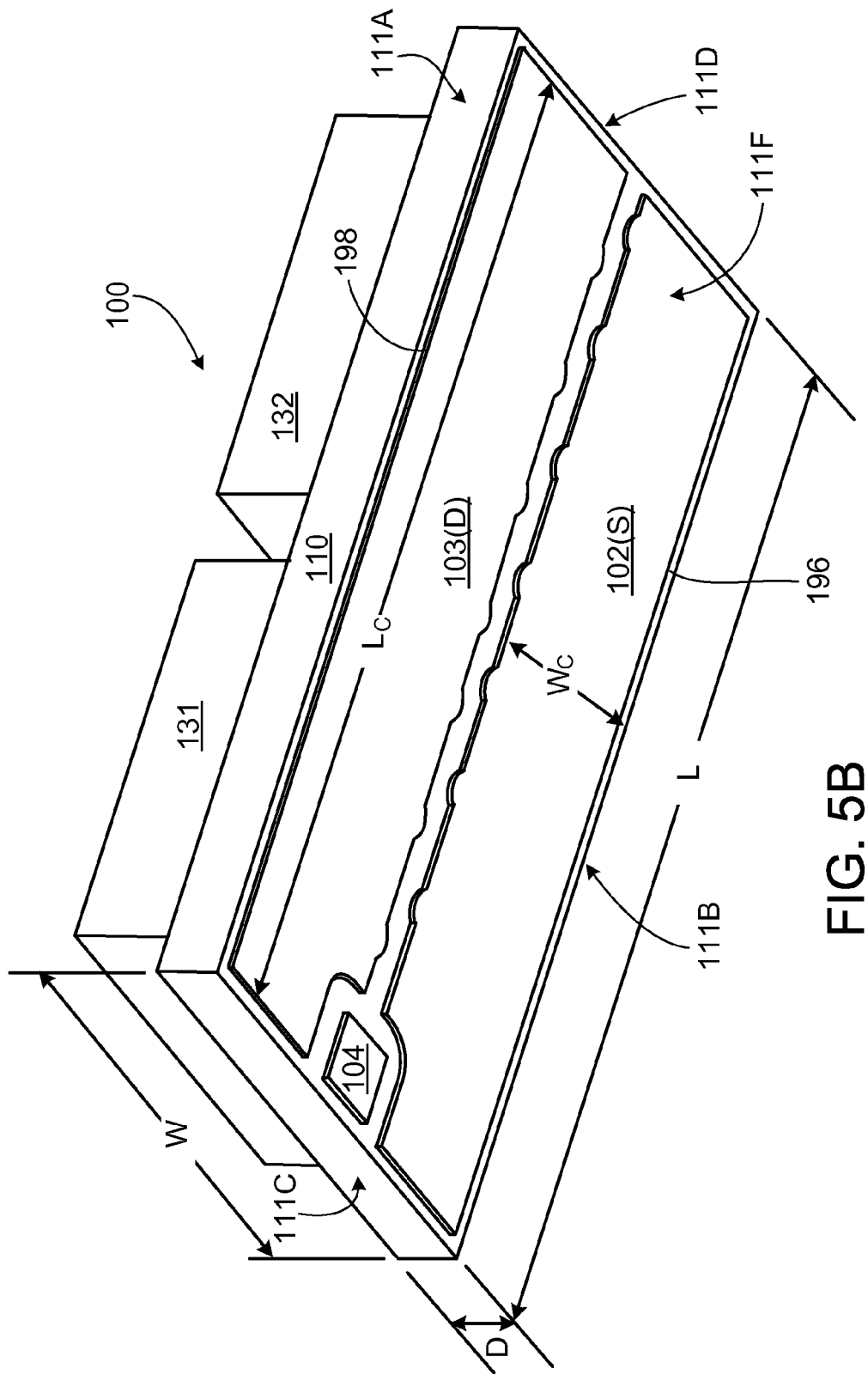
Figure 5C:
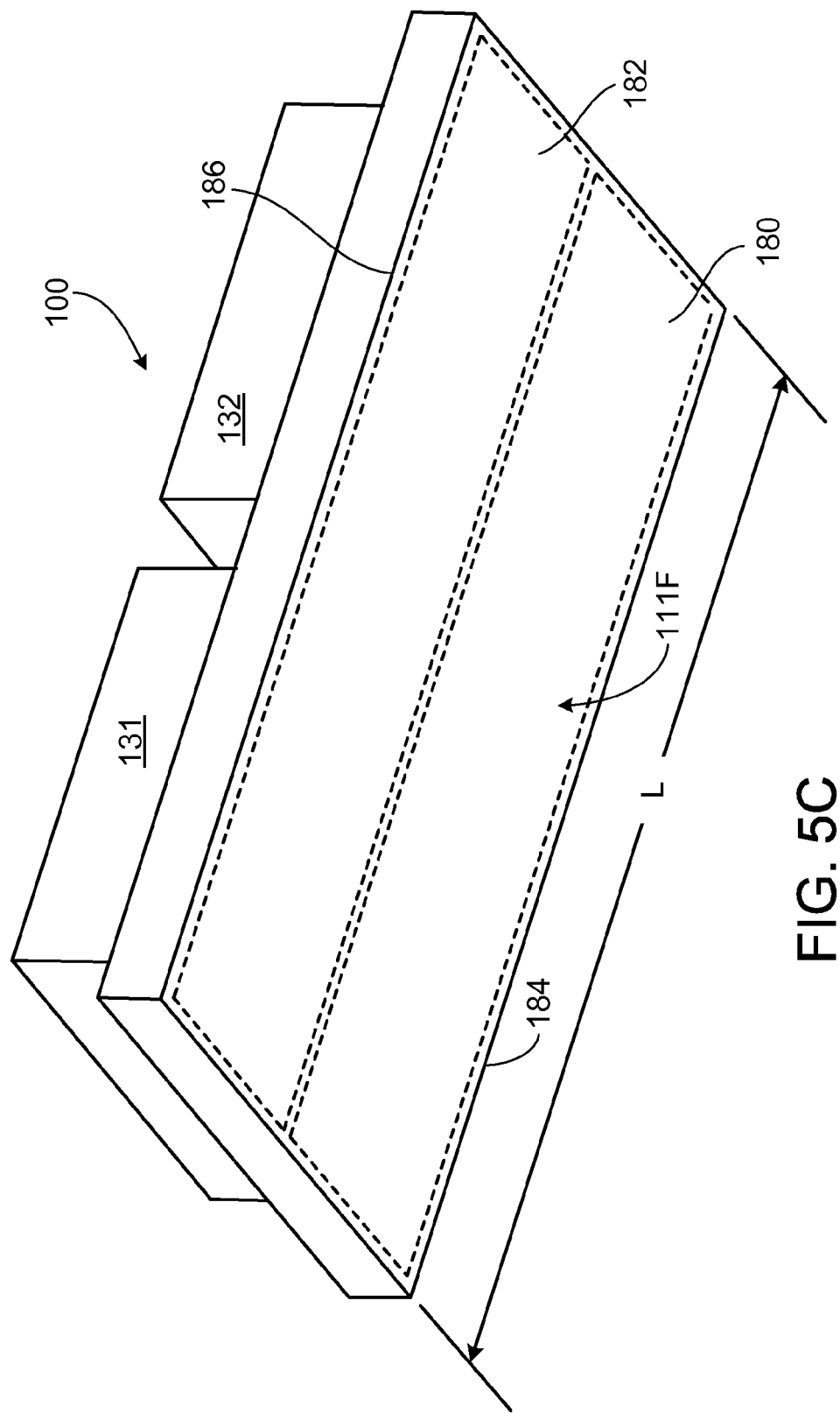
FIGS. 5C and 5D show zones at bottom surfaces of assemblies for use in chip scale packages.
Figure 5D:
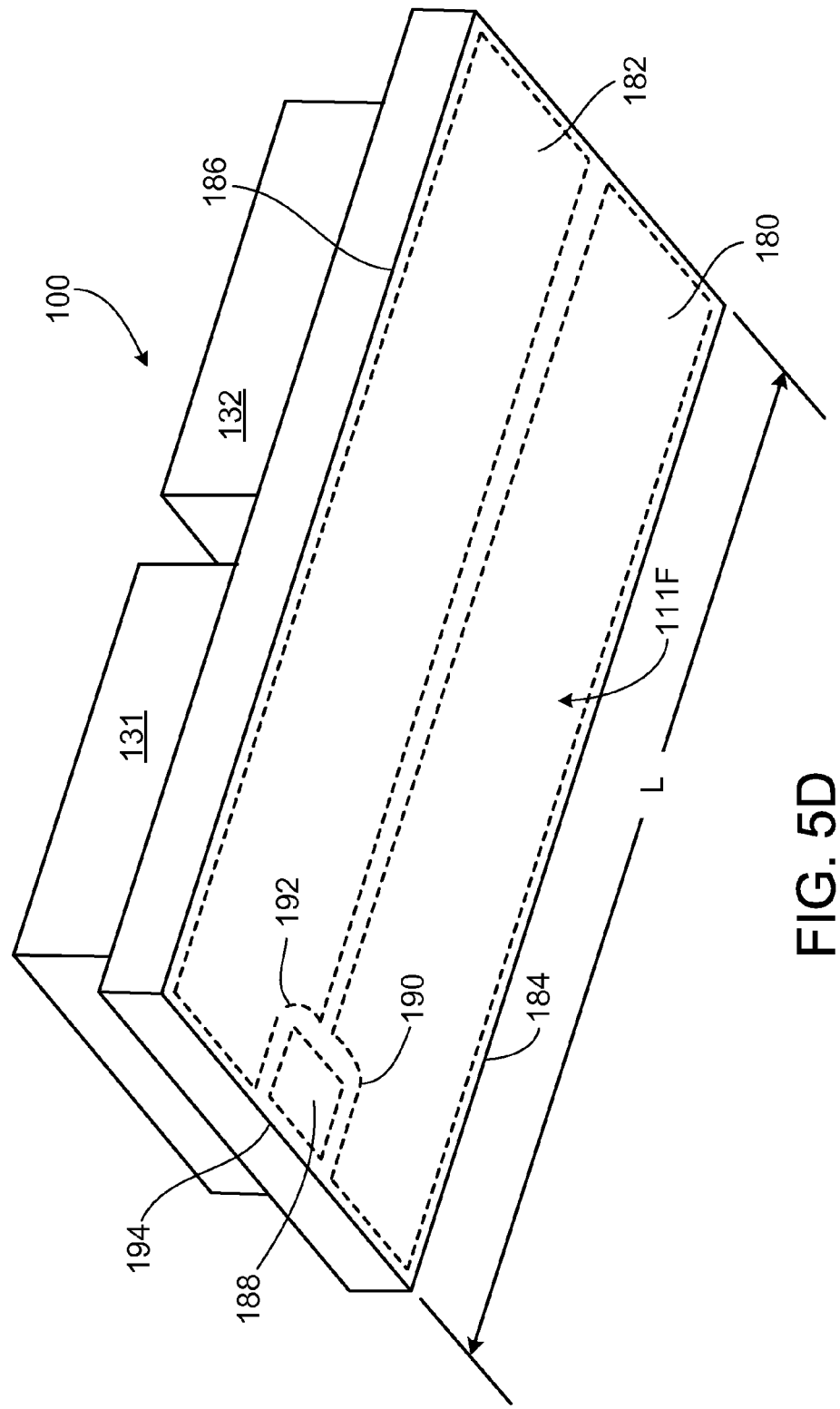

Referring to FIG. 5D, the generally planar bottom surface 111F may be further divided to allow room for a third terminal into a first zone 180, a second zone 182, and a third zone 188. Note that the generally rectangular first and second zones 180 and 182 have a notch (e.g., 190 or 192) to provide space for the third zone 188. As shown, each of the first zone 180 and second zone 182 has a zone length substantially equal to the substrate length L. The first zone 180 is located adjacent to the first edge 184 of the substrate 110, the second zone 182 is located adjacent to the second edge 186 of the substrate 110, and each of the first zone 180 and the second zone 182 has an area occupying nearly half of the bottom surface 111F. The third zone 188 as shown may have an area that is small in relation to the first and second zones 180, 182 and preferably be situated in a laterally interior portion of the bottom surface, i.e., between the first and second terminals. Note that the laterally interior location of the third terminal was chosen to keep the area between the first edge 184 and the first zone 180 and the second edge 186 and the second zone 182 free of terminations and to maximize to the extent possible the contact area of the first and second contacts which are designed to carry high currents. Accordingly the third zone 188 may be located adjacent to a middle portion of a third edge 194 of the substrate 110. In some examples, each of the first and second zones 180, 182 has an area that is at least 50 times greater than the area of the third zone 188 which is generally used for low current control signals. In some examples, each of the first and second zones 180, 182 has a length that is at least 80% or 90% of the length L of the substrate 110.

As shown in FIGS. 5B and 6B, the first terminal 102 has a contact area occupying substantially all of the first zone 180, and has an outside edge 196 occupying substantially all of the first edge 184. Similarly, the second terminal 103 is shown having a contact area occupying substantially all of the second zone 182, and having an outside edge 198 occupying substantially all of the second edge 186. As shown, the first terminal 102 and the second terminal 103 may have substantially the same area; and irregularly shaped inner edges and notches notwithstanding, are generally rectangular in shape; and subject to limits due to manufacturability, safety regulations, and clearance requirements, may each individually occupy nearly half of the total surface area of the bottom surface 111F. In contrast, the third terminal 104 has a relatively small contact area in the third zone 188. The length of each contact (e.g., length Lc, FIG. 5B) is substantially equal to the substrate length, Lc≈L, and the width of each contact (e.g., width Wc, FIG. 5B) is substantially equal to one-half of the substrate width, Wc≈W/2. In some examples, the contact area of each of the first terminal 102 and the second terminal 103 can occupy at least 25%, 30%, or 35% of the surface area of the bottom surface 111F.

FIGS. 9A and 9B show, respectively, an exploded perspective view and a phantom view, looking from above, of the connection of the package 100 of FIG. 5 to conductive traces on a printed circuit assembly 44 (for clarity, only the outlines of terminals 102, 103, and 104 are shown in FIG. 9B). As shown, the first terminal 102 (e.g., the source terminal) is connected to conductive pad 40 and the second terminal 103 (e.g., the drain terminal) is connected to conductive pad 42. In each of FIGS. 9A and 9B the flow of drain-to-source current in the MOSFET is indicated by the arrows marked "I." As shown in FIGS. 9A and 9B, the relative resistances of the respective source and drain connections have been well balanced using substantially equal (and relatively large) area for each of the terminals 102, 103 and PCB traces 40 and 42. Furthermore, by arranging the current flow orthogonal to the longest package dimension, L (FIG. 5B), with terminals 102, 103 having their length, Lc (FIG. 5B), approximating the long dimension, L (FIG. 5B) of the package 100 and maximizing the contact area of terminals 102, 103, the overall in-circuit resistance of the device 100 (including terminals 102, 103 and the matching conductive traces e.g. 40, 42 on the PCB) for a given package size may be minimized, e.g. relative to a package in which the contacts do not run along the longest dimension of the package. For example, the package 100 facilitates PCB traces at least as wide as the package length, L, (and in fact wider than the package as shown in FIG. 9B) maximizing the width of the conductors orthogonal to the current flow and thus minimizing the resistance. In contrast to packages 18, 25 illustrated in FIGS. 2, 3 and 4, which do not balance or optimize contact area or exploit the long dimension of their respective packages to minimize package and PCB trace resistances, the configuration of package 100 may exhibit relatively lower package electrical impedance for a given package mounting surface area.

Figure 7A:
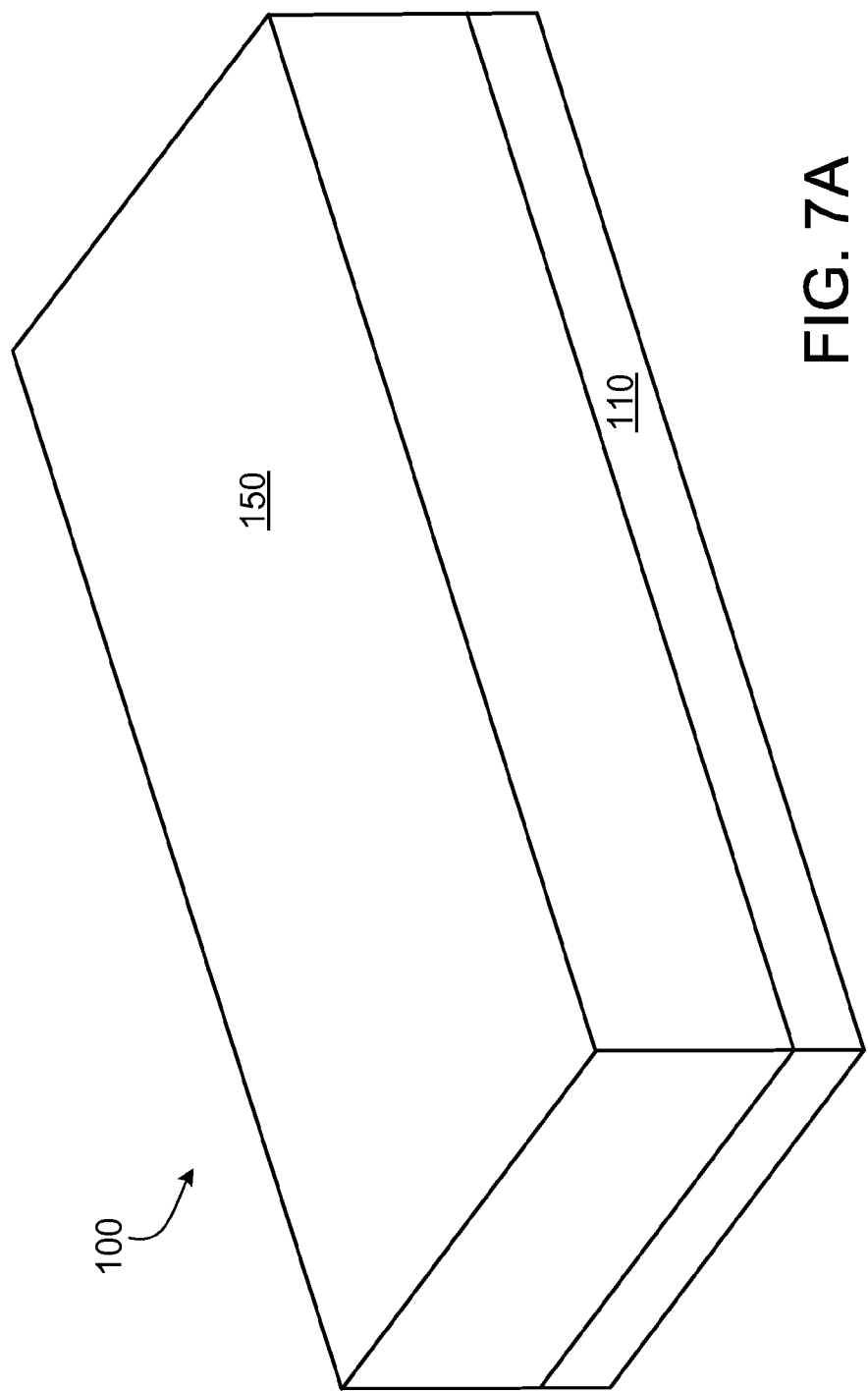
FIGS. 7A and 7B are, respectively, top and bottom perspective views of the assembly of FIGS. 5A and 5B encapsulated with an overmolding compound.
Figure 7B:
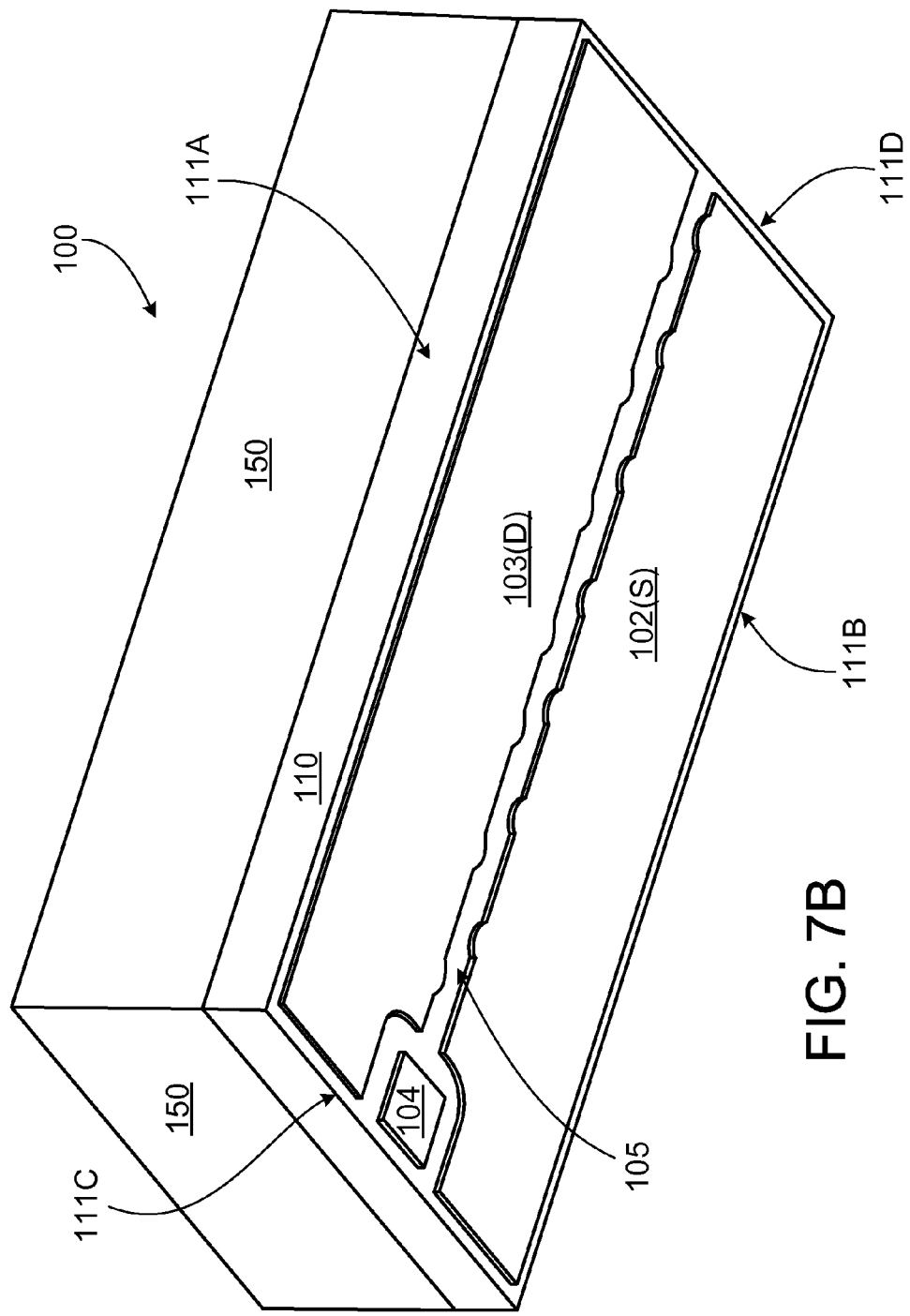
Figure 8A:
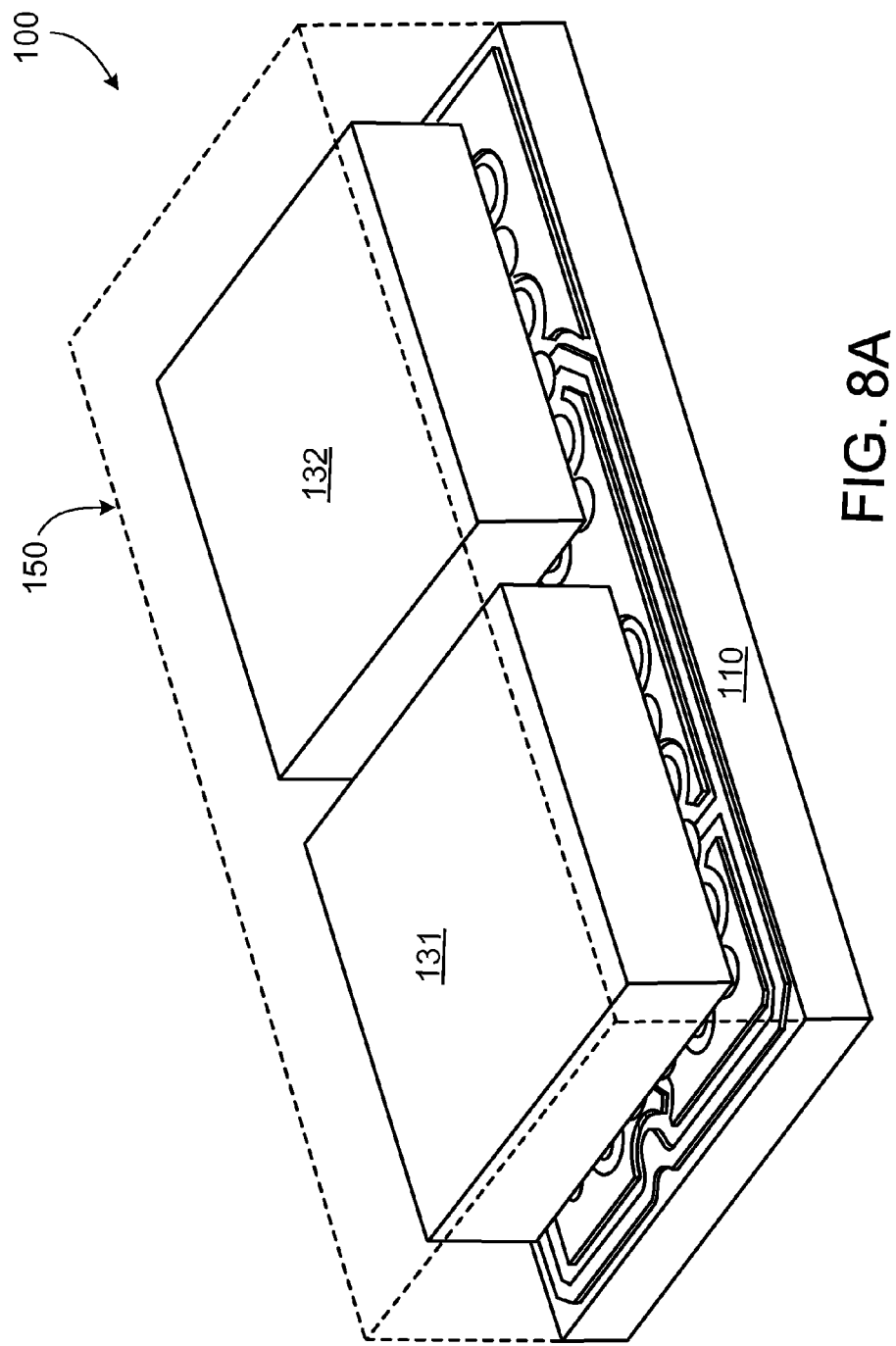
FIGS. 8A and 8B respectively show the encapsulated package assembly of FIGS. 7A and 7B in phantom view through the overmolding compound.
Figure 8B:
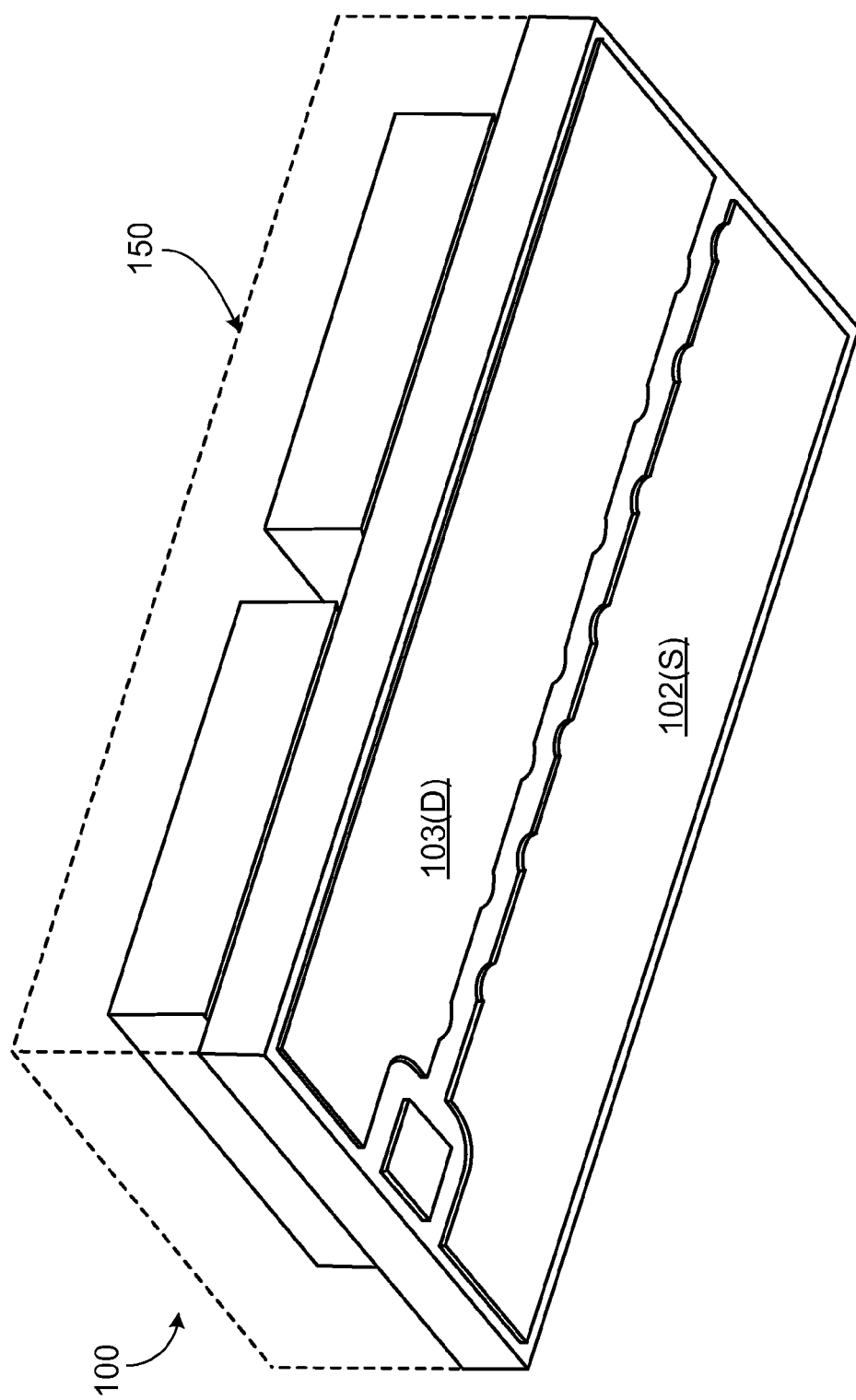

FIGS. 7A and 7B show, respectively, top and bottom perspective views of the package 100 of FIGS. 5A and 5B after encapsulation with a molding compound 150 e.g. GE-100-LFC available from Nitto Denko, Herbis Osaka, 2-5-25, Umeda, Kitta-ku, Osaka 530-0001, Japan. Use of an overmolding compound may provide mechanical integrity and protection of the die. FIGS. 8A and 8B respectively show the encapsulated assembly of FIGS. 7A and 7B in phantom view through the overmolding compound revealing the die 131, 132 enclosed within the region occupied by the overmolding compound 150.

Figure 10A:
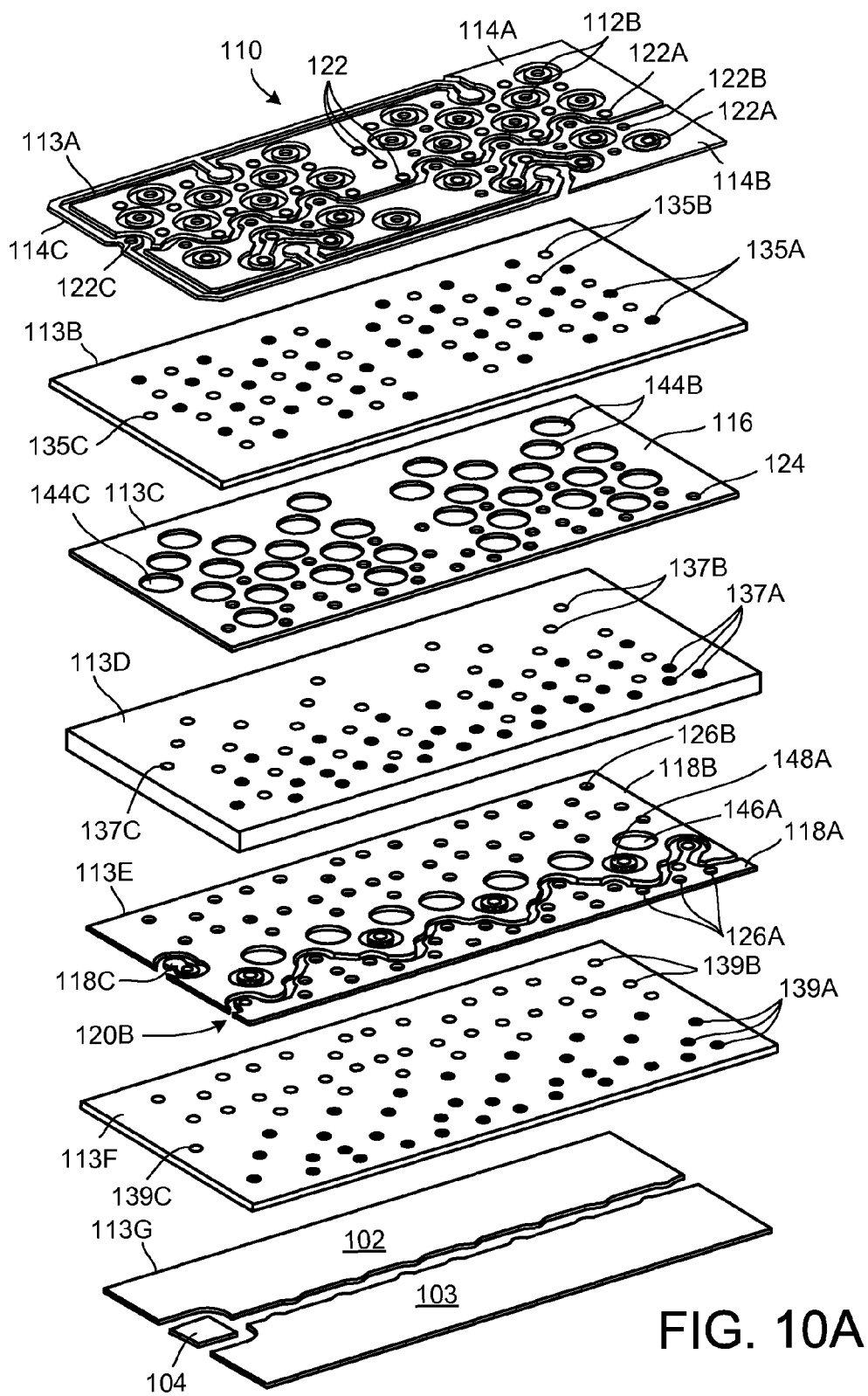
FIGS. 10A and 10B are exploded views of a multilayer PCB.
Figure 10B:
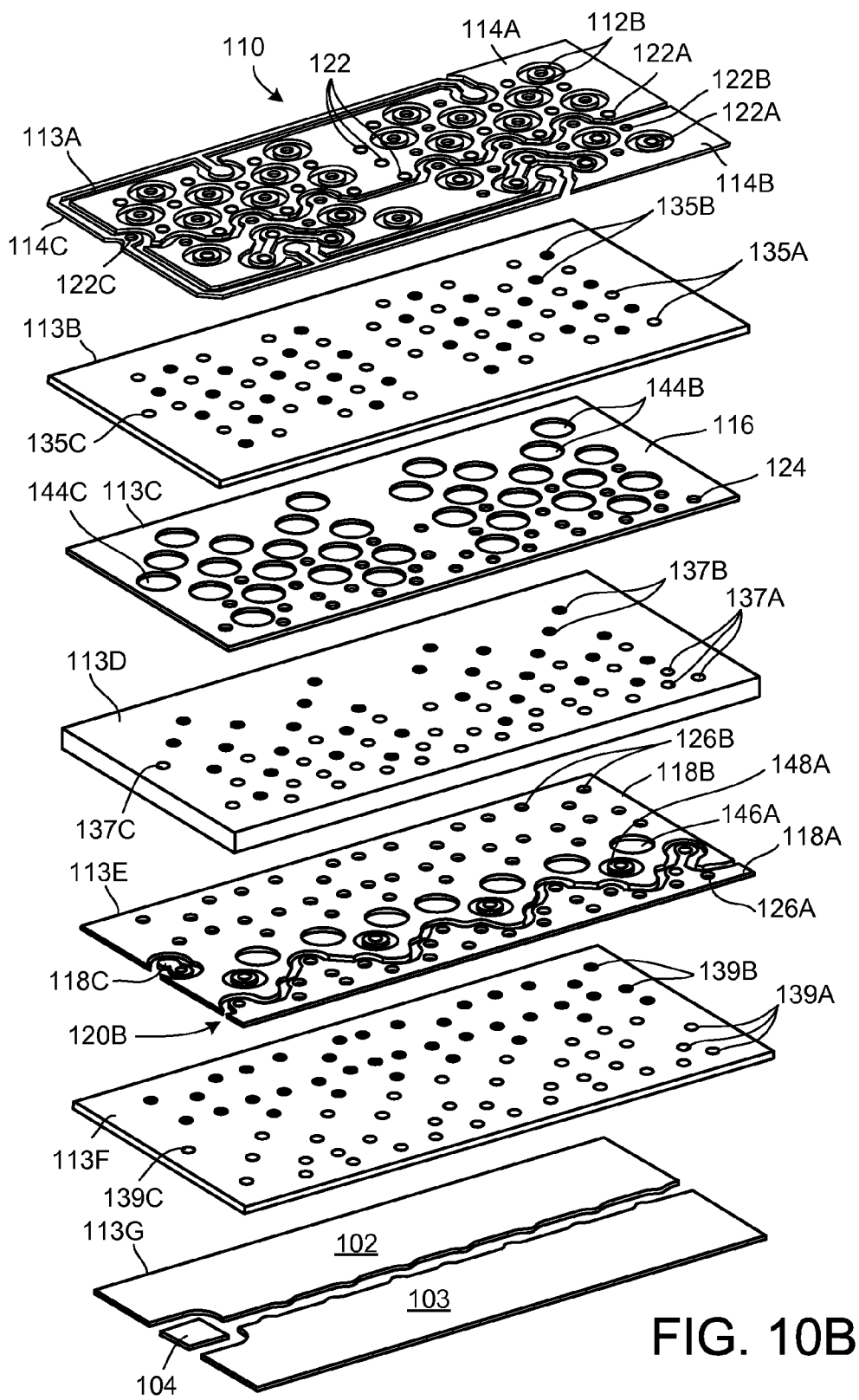

FIGS. 10A, 10B, 11A, and 11B, illustrate details of the multilayer PCB 110 in package 100. The multilayer PCB 110 as shown in FIGS. 10A and 10B includes four conductive layers such as copper layers 113A, 113C, 113E, and 113G separated from adjacent conductive layers by three interleaved insulating layers such as FR-4 glass-epoxy substrate layers 113B, 113D, and 113F for a total of seven layers. The insulating layers, 113B, 113D and 113F are shown having a plurality of conductive vias 135, 137, 139, respectively, that pass vertically through the insulating material in the layer as a means of making connections between adjacent conductive layers. The top conductive layer 113a, as discussed above is shown configured as two conductive sheets 114A, 114B and a conductive trace 114C, each having a plurality of contact points 122, and a plurality of landing pads 112. The bottom conductive layer 113g, as discussed above, is shown configured as first terminal 102, second terminal 103, and control terminal 104. The third layer, conductive layer 113c, as shown is configured as a single conductive sheet 116 having a plurality of connection points 124 on the sheet and clearance holes 144 formed in the sheet to provide isolation around connections passing through layer 113C without contacting sheet 116. The fifth layer, conductive layer 113E, as shown is configured as two conductive sheets 118A ad 118B, each having a plurality of connection points 126A, 126B and clearance holes 146 formed to provide isolation around connections passing through layer 113D without contacting the sheet in which it is formed. The fifth layer additionally includes conductive region 118C. Sheets 118A and 118B are electrically separated from each other by etched regions, e.g. etched region 120B.

The interconnections internal to multilayer PCB 110 forming the respective connections between the source, drain, and gate solder balls on die 131 and the first, second and control terminals 102, 103 and 104 are described with reference to FIGS. 6A, 6B, 10A, 10B, 11A, and 11B. The interconnections for die 132 are essentially the same as for die 131 and therefore not discussed. For ease of reference, the suffices "A," "B," and "C" are used respectively to denote drain, source and gate related features in FIGS. 6A, 10A, 10B, 11A, and 11B. Similarly, FIGS. 10A and 11A illustrate the drain related connections and features and FIGS. 10B and 11B focus on the source related connections and features Sheets 114A and 114B (layer 113A) are dedicated to forming drain and source interconnections, respectively. Isolation regions 120A are formed around source (drain) landing pads 112B (112A) which happen to lie within the conductive region dedicated to the drain 114A (or source 114B). The solder balls 133 on die 132 (FIG. 6B) connect to respective landing pads 112 and connection points 122 on top conductive layer 113A (FIGS. 6A, 10, 11), e.g. drain solder balls 133A (source 133B) connect to drain landing pads 112A (source 112B) or drain connection points 122A (source 122B) on drain sheet 114A (source 114B). Referring to FIG. 11A, the landing pads 112A and connection points 122A for the drain solder balls 133A are shown filled while the landing pads 112B and connection points 122B for the source solder balls 133B are not. Conversely in FIG. 11B, the landing pads 112B and connection points 122B for the source solder balls 133B are shown filled while the landing pads 112A and connection points 122A for the drain solder balls 133A are not. As shown in FIGS. 11A, 11B, the contacts may be arranged to form alternating diagonal rows of drain and source contacts, e.g. rows 170B of source contacts (FIG. 11B) and rows 170A of drain contacts (FIG. 11A).

Each of the drain and source landing pads 112A, 112B and connection points 122A, 122B are arranged to electrically connect to respective vias 135A, 135B in layer 113B. In FIG. 11A, the drain vias 135A are shown filled in for clarity. (Similarly in FIG. 11B, the source vias 135B are shown filled in for contrast). Referring to FIG. 10A, the conductive sheet 114A and landing pads 112A associated with the drain connections are connected to conductive sheet 116 by drain vias 135A. In FIGS. 10A-11B, contact points shown on a conductive layer e.g. contacts 122, 112 (layer 113A), 124 (layer 113C), and 126 (layer 113E) indicate a downward connection to a conductive via in the insulating layer below e.g. vias 135 (layer 113B), vias 137 (layer 113D), and vias 139 (layer 113F). Conductive sheet 116 is in turn connected to sheet 118A by vias 137A, which is connected to terminal 103 by vias 139A. Note that seven clearance holes are provided in sheet 118B and four isolated conductive regions are provided in layer 113E for facilitating drain connections directly between sheet 116 and terminal 103. A portion of the drain vias 137A (layer 113D) connect sheet 116 (layer 113C) to sheet 118A (layer 113E). Some of the drain vias 137A pass through the clearance holes 146A to connect to drain vias 139A in layer 113F. The remainder of the drain vias 137A connect to isolated conductive regions 148A which in turn connect to drain vias 139A. All of the drain vias 139A (layer 113F) connect to terminal 103 on layer 113G.

The source connections will be described with reference to FIG. 10B. The conductive sheet 114B and landing pads 112B associated with the source connections are connected to conductive sheet 118B by source vias 135B which in turn are connected to conductive vias 137B. Note vias 135B and 137B interconnect and pass through the clearance holes 144B (layer 113C) without making contact with conductive sheet 116. Conductive sheet 118B is connected to terminal 102 by vias 139B.

In general, the PCB 110 is designed to balance and minimize the cumulative resistance of the drain and source interconnections, e.g. by using an equal number of conductive vias, etc. For example, an approximately equal distribution and number of vias are shown for each of the drain and source interconnects. As shown in FIG. 11A, an additional row 171A of vias 135A is provided that do not directly correspond to a landing pad or connection point associated with a solder ball 133. These additional conductive vias 135A are provided to decrease the resistance of the interconnection between layers. Similarly additional vias 137A, 137B and 139A, 139B are provided in layers 113D and 113F to reduce resistance and improve thermal performance.

Because of low current requirements, all of the control, e.g. MOSFET gate, connections are joined by conductive trace 114C in layer 113A which connects to a single via 135C (layer 113B) which passes through clearance hole 144C (layer 113C) connecting to via 137C (layer 113D) and then conductive region 118C (layer 113E), which in turn connects to via 139C (layer 113F) finally connecting to terminal 104 (layer 113G).

Figure 12:
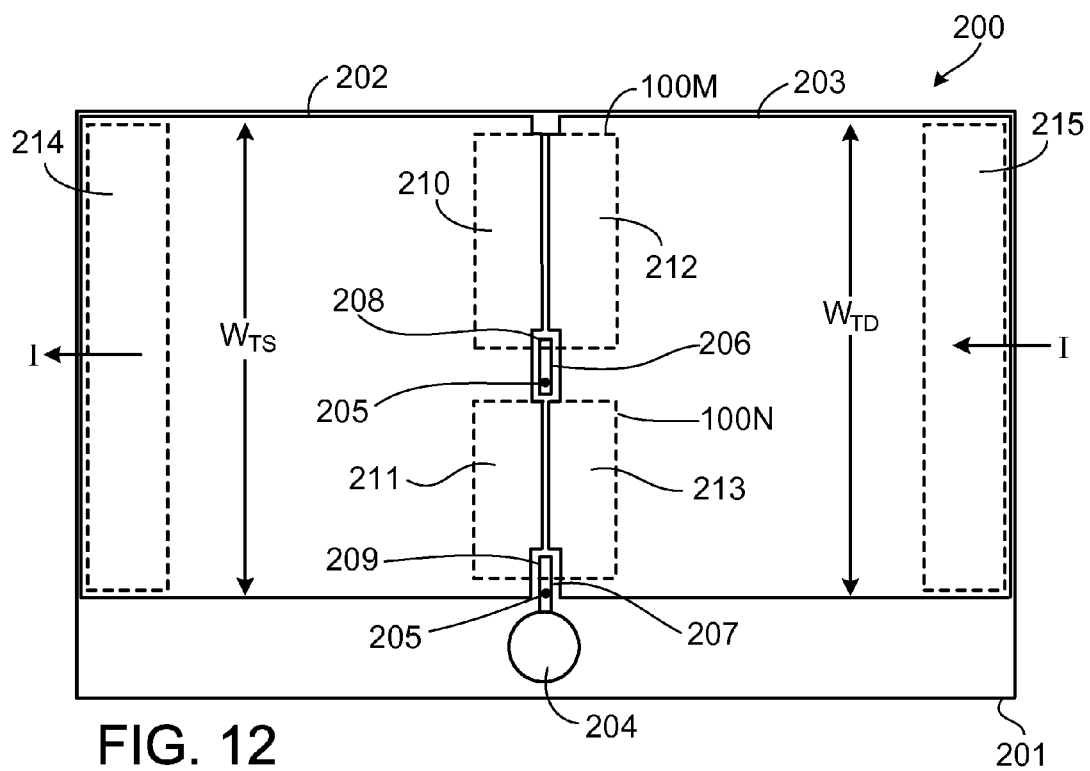
FIG. 12 is a phantom view, looking from above, of a printed circuit board assembly incorporating two assemblies shown in FIGS. 5-9 connected in parallel.
Figure 13:
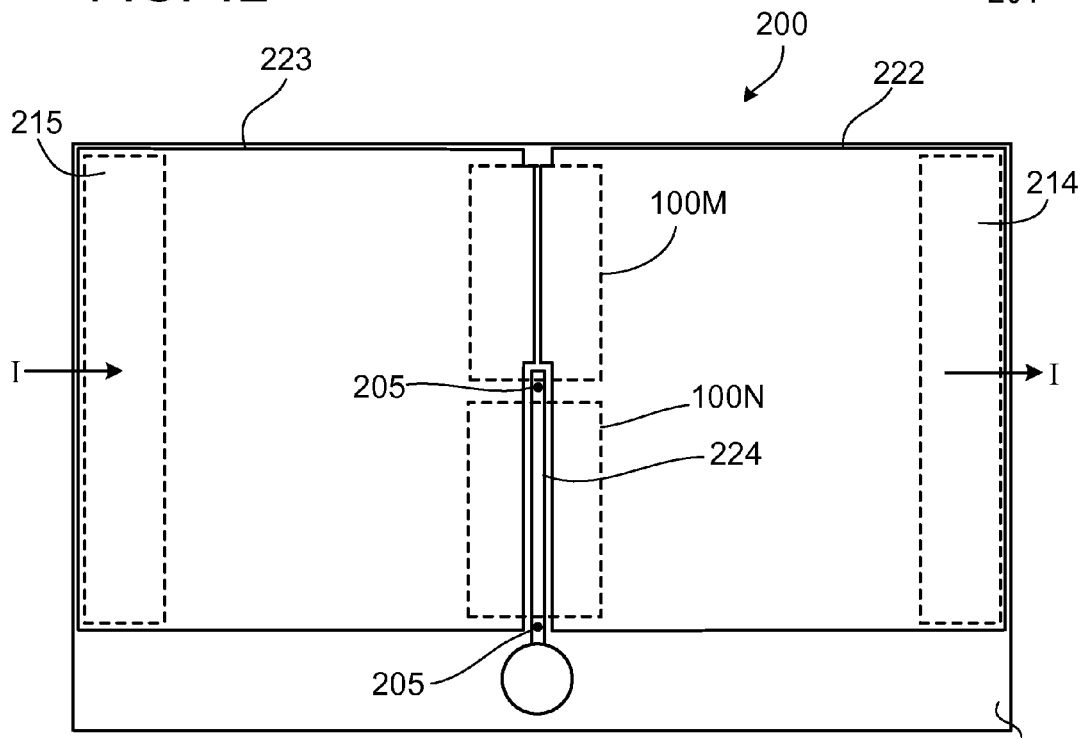
FIG. 13 is a bottom view of the printed circuit assembly of FIG. 12.

A three layer printed circuit assembly 200 using two assemblies 100 (FIGS. 5-9) connected in parallel is shown in FIGS. 12 and 13. As shown, the printed circuit board 201 includes two conductive layers separated by an insulating substrate, one conductive layer on the top surface and one conductive layer on the bottom surface. The top view of FIG. 12 shows two packages 100M, 100N connected to conductive traces on the top surface of printed circuit board 201. FIG. 13 is a bottom view of the assembly in FIG. 12 flipped about a vertical axis. For clarity, only the outlines of devices 100M and 100N are shown in FIGS. 12 and 13.

As shown, the two devices 100M, 100N are arranged end to end to increase the effective contact length of the paralleled devices and minimize the electrical resistance. The top conductive layer is thus divided into two conductive sheets 203 and 202. Drain contact areas 212 and 213 may be provided on conductive sheet 203 and source contact areas 210 and 211 may be provided on conductive sheet 202 for accommodating the respective terminals 103, 102 (FIGS. 5B, 6B, 7B, 8B, 9A, 9B) of each device 100M, 100N as shown. Connections to the gate terminals 104 (FIGS. 5B, 6B, 7B, 8B, 9A, 9B) of each device 100M, 100N may be accommodated by very small conductive regions 206, 207 including gate contact areas 208, 209 on the top conductive layer. To minimize the impact of the gate connections on the main conductors, i.e. conductive sheets 203, 202 carrying the drain-to-source current, the otherwise isolated gate conductive regions 206, 207 are electrically connected by trace 224 (using conductive vias 205) on the bottom conductive layer (FIG. 13). Trace 224 may be placed between conductive sheets 222 and 223, made very thin in view of the low current requirements, and arranged to run perpendicular to the flow of the drain-to-source current to minimize the impact on the conductor area available to the large conductors. The gate connection may be made available, preferably without impacting main conductor area or main current flow, i.e. drain to source current, e.g. off to the side as shown using contact area 204. As divided, the remainder of the bottom conductive layer is formed into conductive sheets 223 and 222 which are connected using a plurality of vias (not shown) to their respective counterparts 203, 202 on the top surface to further reduce resistance. Thus sheets 203 and 223 are connected in parallel and sheets 202 and 222 are connected in parallel.

Referring to FIG. 12, the drain conductive sheet 203 and source conductive sheet 202 each have a respective conductor width, $W_{TD}$ and $W_{TS}$, measured orthogonal to the direction of current flow. The flow of drain-to-source current in the MOSFETs is indicated by the arrows marked "I" in FIGS. 12 and 13. Preferably as shown, the widths, $W_{TD}$ and $W_{TS}$, of the drain and source conductors, are equal to or greater than the sum of the lengths of the devices.

Contact area 215 may be provided for accepting connections from an output of a power converter, e.g. the type described in Vinciarelli, et al., Power Converter Package and Thermal Management, U.S. Pat. No. 7,361,844; Vinciarelli, et al., Surface Mounting A Power Converter, U.S. Pat. No. 6,940,013; both incorporated herein by reference. Similarly, contact area 214 may be provided for accepting connections to a load. It will be appreciated that the principles applied to the construction and arrangement of the PCB assembly 200 may be extended to include a return current path and additional circuitry.

The packages for power MOSFETs described above may have one or more of the following advantages. The ON resistance of the package impedances can be very low, the cumulative resistance of the drain and source interconnections can be reduced, and the thermal performance of power MOSFET devices can be improved. This way, the benefits of using power MOSFET devices having very low ON resistances can be more fully realized.

Figure 5E:
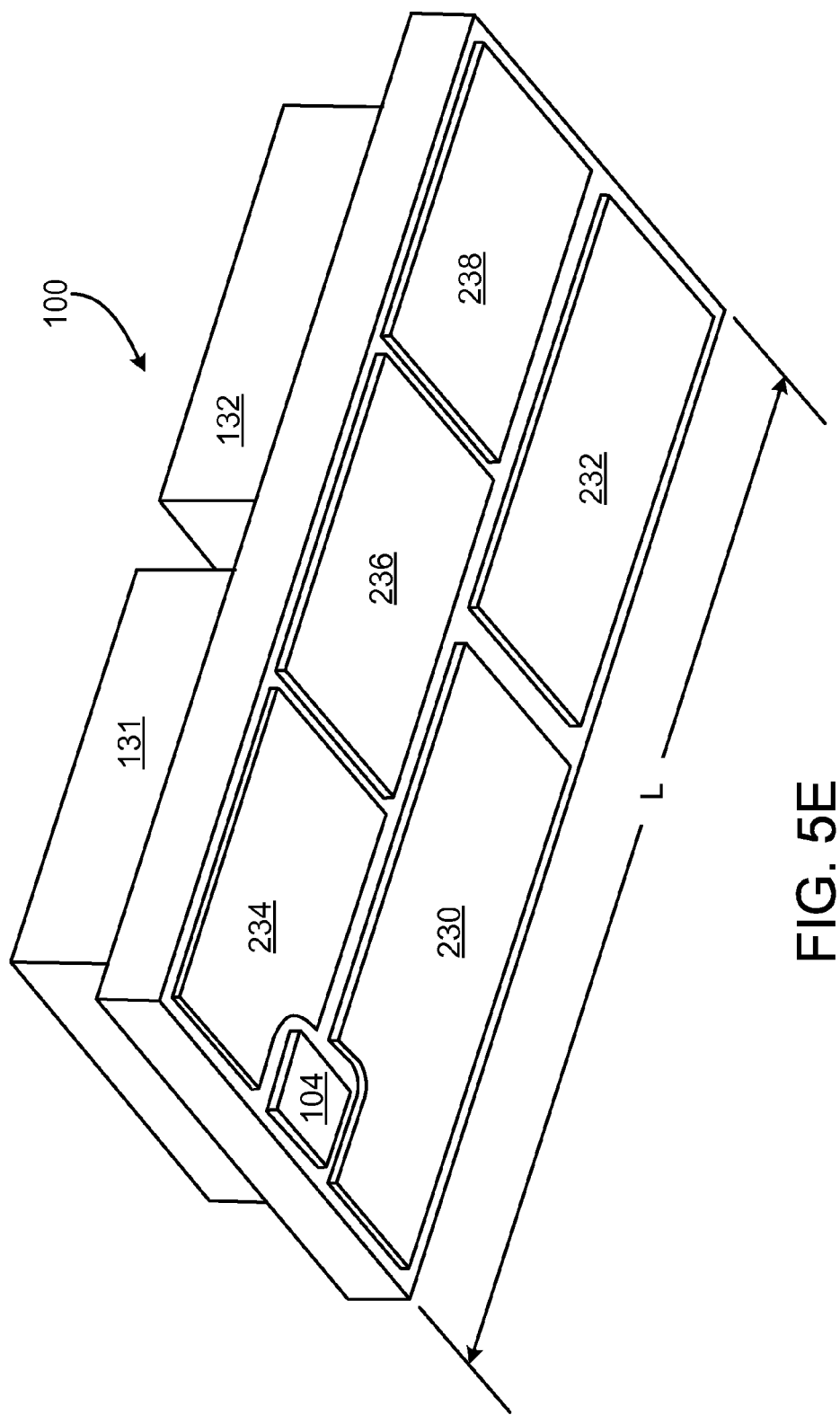
FIG. 5E show a bottom perspective view of an assembly for use in a chip scale package.

A number of embodiments of the invention have been described. Nevertheless, it will be understood that various modifications may be made without departing from the spirit and scope of the invention. For example, the edges of the contact areas of the first and second terminals 102 and 103 do not necessarily have to be entirely straight, and can have slightly wavy shapes, as shown in FIG. 5B. The first and second terminals 102 and 103 may comprise a single continuous piece of a conductive material (as shown in FIG. 5B), or a plurality of individual conductive regions (as shown in FIG. 5E), which may be electrically connected together internally in the substrate 110 (such as conductive layers, traces, and vias in the layers 113B to 113F of FIG. 10A) or externally on an external circuit board. As shown for example in FIG. 5E, the first terminal 102 may include individual contact areas 230 and 232 that are electrically coupled together, and the second terminal 103 may include individual contact areas 234, 236, and 238 that are electrically coupled together. In this example, the combination of the contact areas 230 and 232 occupy substantially all of the first zone 180, and the combination of the contact areas 234, 236, and 238 occupy substantially all of the second zone 182.

Additionally, other BGA patterns and contact structures may be used to connect the die to the PCB, the die may have an equal number of drain and source contacts, and other PCB conductive patterns may be used to interconnect the die contacts to the terminals. Accordingly, other embodiments are within the scope of the following claims.

What is claimed is:

1. Apparatus comprising:
a chip-scale package for semiconductor devices including a generally rectangular substrate having (i) three dimensions including a length, a width, and a thickness, (ii) each dimension being generally orthogonal to the other dimensions, (iii) the substrate length being greater than or equal to the substrate width; and (iv) length and width defining a first generally planar surface on which one or more semiconductor dice may be mounted and a generally planar second surface on which two or more conductive terminals may be formed, (v) the first and second surfaces having a first edge and a second edge defined by the substrate length;
the second surface comprising a first zone and a second zone, the first and second zones each being generally rectangular in shape, having a zone length substantially equal to the substrate length and being located adjacent to the first and second edges, respectively, and having an area occupying substantially half of the second surface;
a first terminal having a contact area disposed on the second surface, occupying substantially all of the first zone, and having an outside edge occupying substantially all of the first edge;
a second terminal having a contact area disposed on the second surface, occupying substantially all of the second zone, and having an outside edge occupying substantially all of the second edge.

2. The apparatus of claim 1 further comprising:
a first semiconductor die mounted to the first surface, having a plurality of first contacts electrically connected to the first terminal and a plurality of second contacts mounted to the second terminal;
wherein the first surface is approximately the same as the semiconductor die in size.

3. The apparatus of claim 2 wherein the second surface further comprises a third zone near a central portion of a third edge, the third zone having an area that is small in relation to the first and second zones;
a third terminal having a contact area disposed on the second surface in the third zone.

4. The apparatus of claim 3 in which the first zone has a notch near the third zone.

5. The apparatus of claim 3 wherein the package has exactly three terminals and the contact area of each of the first and second terminals is at least 50 times greater than the contact area of the third terminal.

6. The apparatus of claim 2 wherein the package has exactly two terminals, the contact area of each of the first and second terminals is at least 30 percent of the area of the second surface.

7. The apparatus of claim 2 wherein the package is free of conductive terminations in areas between the outside edges of the first and second terminals and the first and second edges.

8. The apparatus of claim 1 in which each of the first and second zones has a length that is at least 90% of the length of the substrate.

9. The apparatus of claim 1 in which each of the first and second zones has a length that is at least 80% of the length of the substrate.

10. The apparatus of claim 1 further comprising:
a first semiconductor die mounted to the first surface, having a plurality of first contacts electrically connected to the first terminal and a plurality of second contacts mounted to the second terminal;
a second semiconductor die mounted to the first surface adjacent to the first semiconductor die, the second die having a plurality of first contacts electrically connected to the first terminal and a plurality of second contacts electrically connected to the second terminal;
wherein the first surface is approximately the same as a combined size of the first and second semiconductor dice; and
wherein the substrate length is approximately twice the substrate width.

11. The apparatus of claim 10 wherein the second surface further comprises a third zone near a central portion of a third edge, the third zone having an area that is small in relation to the first and second zones;
- a third terminal having a contact area disposed on the second surface in the third zone.

12. The apparatus of claim 11 wherein the package has exactly three terminals and the contact area of each of the first and second terminals is at least 50 times greater than the contact area of the third terminal.

13. The apparatus of claim 10 further comprising a printed circuit board having first and second landings for accommodating the first and second terminals, wherein current flows from the first landing into the first terminal and out through the second terminal into the second landing, and wherein the current flows in a direction substantially orthogonal to the substrate length.

14. The apparatus of claim 10 wherein the package has exactly two terminals, the contact area of the first and second terminals each comprises 25 percent or more of the area of the second surface.

15. The apparatus of claim 10 wherein the package has exactly two terminals, the contact area of the first and second terminals each comprises 30 percent or more of the area of the second surface.

16. The apparatus of claim 10 wherein the package has exactly two terminals, the contact area of the first and second terminals each comprises 35 percent or more of the area of the second surface.

17. The apparatus of claim 10 wherein the package is completely free of conductive terminations between the outside edges of the first and second terminals and the first and second edges.

18. The apparatus of claim 10 wherein the package is substantially free of conductive terminations between the outside edges of the first and second terminals and the first and second edges.

19. The apparatus of claim 1 further comprising:
- a plurality of semiconductor dice mounted adjacent to each other to the first surface, having a plurality of first contacts electrically connected to the first terminal and a plurality of second contacts mounted to the second terminal;
- wherein the first surface is approximately the same as a combined size of the semiconductor dice.

20. The apparatus of claim 1 further comprising:
- a circuit board having a first conductive trace including a first contact area for making an electrical connection to the first terminal of the chip scale package, the first contact area accommodating substantially all of the first terminal;
- a second conductive trace including a first contact area for making electrical connection to the second terminal of the chip scale package, the first contact area accommodating substantially all of the second terminal;
- the first and second conductive traces extending generally orthogonally from the respective first and second terminals, and having a conductor width substantially equal to or greater than the substrate length.

21. The apparatus of claim 20 further comprising:
- a second chip-scale package for semiconductor devices including
- a generally rectangular substrate having (i) three dimensions including a length, a width, and a thickness, (ii) each dimension being generally orthogonal to the other dimensions, (iii) the substrate length being greater than or equal to the substrate width; and (iv) length and width defining a first generally planar surface on which one or more semiconductor dice may be mounted and a generally planar second surface on which two or more conductive terminals may be formed, (v) the first and second surfaces having a first edge and a second edge defined by the substrate length;
- the second surface comprising a first zone and a second zone, the first and second zones each being generally rectangular in shape, having a zone length substantially equal to the substrate length and being located adjacent to the first and second edges, respectively, and having an area occupying substantially half of the second surface;
- a first terminal having a contact area disposed on the second surface, occupying substantially all of the first zone, and having an outside edge occupying substantially all of the first edge;
- a second terminal having a contact area disposed on the second surface, occupying substantially all of the second zone, and having an outside edge occupying substantially all of the second edge; and
- wherein the first conductive trace of the circuit board includes a second contact area for making an electrical connection to the first terminal of the second chip scale package, the first contact area accommodating substantially all of the first terminal of the second chip-scale package;
- the second conductive trace of the circuit board includes a second contact area for making electrical connection to the second terminal of the second chip scale package, the second contact area accommodating substantially all of the second terminal of the second chip-scale package;
- the first and second contact areas of the first and second conductive traces are arranged end-to-end lengthwise; and
- the conductor width of at least one of the first and second conductive traces is substantially equal to or greater than the sum of the substrate length of the chip scale package and the substrate length of the second chip scale package.

* * * * *